US010347862B2

(12) United States Patent
Sonoda et al.

(10) Patent No.: US 10,347,862 B2
(45) Date of Patent: Jul. 9, 2019

(54) EL DISPLAY DEVICE AND METHOD FOR MANUFACTURING EL DISPLAY DEVICE

(71) Applicant: Sharp Kabushiki Kaisha, Sakai, Osaka (JP)

(72) Inventors: Tohru Sonoda, Sakai (JP); Takeshi Hirase, Sakai (JP); Tetsuya Okamoto, Sakai (JP); Tohru Senoo, Sakai (JP); Mamoru Ishida, Sakai (JP)

(73) Assignee: Sharp Kabushiki Kaisha, Sakai (JP)

( * ) Notice: Subject to any disclaimer, the term of this patent is extended or adjusted under 35 U.S.C. 154(b) by 53 days.

(21) Appl. No.: 15/564,213

(22) PCT Filed: Apr. 5, 2016

(86) PCT No.: PCT/JP2016/061161
§ 371 (c)(1),
(2) Date: Oct. 4, 2017

(87) PCT Pub. No.: WO2016/163367
PCT Pub. Date: Oct. 13, 2016

(65) Prior Publication Data
US 2018/0130972 A1 May 10, 2018

(30) Foreign Application Priority Data
Apr. 9, 2015 (JP) ................................ 2015-080430

(51) Int. Cl.
*H01L 51/52* (2006.01)
*H01L 27/32* (2006.01)
*H01L 51/56* (2006.01)

(52) U.S. Cl.
CPC ...... *H01L 51/5246* (2013.01); *H01L 27/3244* (2013.01); *H01L 27/3246* (2013.01);
(Continued)

(58) Field of Classification Search
CPC ............ H01L 51/5246; H01L 27/3276; H01L 51/5203; H01L 51/5253
(Continued)

(56) References Cited

U.S. PATENT DOCUMENTS

2006/0001961 A1* 1/2006 Gibilini ................ G03B 21/625
359/456
2006/0066229 A1* 3/2006 Nimura ............... H01L 27/3267
313/506
(Continued)

FOREIGN PATENT DOCUMENTS

JP 2012-94429 A 5/2012
JP 2012094429 A * 5/2012
(Continued)

OTHER PUBLICATIONS

Official Communication issued in International Patent Application No. PCT/JP2016/061161, dated Jul. 5, 2016.

Primary Examiner — Marc Anthony Armand
(74) Attorney, Agent, or Firm — Keating & Bennett, LLP

(57) ABSTRACT

An organic EL display device (1) includes: a plurality of organic EL elements (30) each including a lower electrode (31), an EL layer (32), and an upper portion (33); and a sealing layer (40) covering the plurality of organic EL elements (30), the organic EL display device (1) having, in a non-light-emitting portion (5) of a display region (2), at least one contact hole (34) extending through at least the upper electrode (33) and the EL layer (32) and allowing the sealing layer (40) to be in contact with a surface of a layer below the organic EL layer (32).

20 Claims, 14 Drawing Sheets

(52) U.S. Cl.
CPC ...... *H01L 27/3276* (2013.01); *H01L 51/5203* (2013.01); *H01L 51/5253* (2013.01); *H01L 51/56* (2013.01); *H01L 2227/323* (2013.01)

(58) Field of Classification Search
USPC .......................................................... 257/40
See application file for complete search history.

(56) References Cited

U.S. PATENT DOCUMENTS

| | | |
|---|---|---|
| 2007/0291215 A1 | 12/2007 | Koo et al. |
| 2012/0217516 A1 | 8/2012 | Hatano et al. |
| 2013/0314647 A1* | 11/2013 | Yim .................. G02F 1/133528 349/69 |
| 2014/0139761 A1* | 5/2014 | Yanagawa ............... G06F 3/044 349/12 |
| 2014/0206117 A1* | 7/2014 | Sonoda ............... H01L 51/0023 438/29 |

FOREIGN PATENT DOCUMENTS

| | | |
|---|---|---|
| JP | 4960762 B2 | 6/2012 |
| JP | 2012-190794 A | 10/2012 |
| JP | 2012-204012 A | 10/2012 |

* cited by examiner

EL DISPLAY DEVICE AND METHOD FOR MANUFACTURING EL DISPLAY DEVICE

TECHNICAL FIELD

The present invention relates to an EL display device and a method for producing an EL display device.

BACKGROUND ART

EL display devices including an EL element, which is based on electroluminescence (hereinafter referred to as EL) of an organic or inorganic material, have been attracting attention, as EL display devices have a higher response speed and a wider viewing angle than liquid crystal display devices.

EL elements are, however, typically susceptible to, for example, water and oxygen. EL elements react with even a small amount of water or oxygen, which degrades the properties of the EL elements and shortens the life of a display device including such an EL element.

EL elements are roughly classified into organic EL elements, which include an organic substance for a light-emitting layer, and inorganic EL elements, which include an inorganic substance for a light-emitting layer. An organic EL element includes an organic EL layer containing a light-emitting layer as well as a lower electrode and an upper electrode that sandwich the organic EL element. An inorganic EL element includes, for example, a light-emitting layer and dielectric layers sandwiching the light-emitting layer as well as a lower electrode and an upper electrode that sandwich the three layers.

Entry of, for example, water or oxygen into such an EL element leads to, for example, oxidation or hydroxylation of a component such as the light-emitting layer or upper electrode or to crystallization thereof. This results in a dark spot, that is, a non-light-emitting spot, and/or in a shrinkage, that is, a non-light-emitting region expanding and a light-emitting region shrinking accordingly. Dark spots and the shrinkage are known to shorten the life of EL elements. Thus, there is a need to minimize, for example, entry of water or oxygen into EL elements.

In view of the above, there has been known a technique of, for example, forming a sealing layer on an EL element to seal up the EL element for prevention of entry of, for example, water or oxygen into the EL element (see, for example, Patent Literature 1).

Such a sealing layer is made up of an inorganic layer or a stack of an inorganic layer and an organic layer. The inorganic layer has the function of preventing entry of water for moisture prevention, and thus serves as a barrier layer. The organic layer is used as a buffer layer (stress relaxation layer): It relaxes stress on the inorganic layer, covers a pinhole, and/or prevents a crack in and peeling of the inorganic layer when it is being disposed.

CITATION LIST

Patent Literature

[Patent Literature 1]
Japanese Patent Publication No. 4960762 (Registration date: Mar. 30, 2012)

SUMMARY OF INVENTION

Technical Problem

A barrier layer having a large thickness receives a large membrane stress and thus becomes peeled easily. A barrier layer having a small thickness, however, has a poor moisture barrier characteristic, and when being bent, becomes cracked easily and broken easily. A buffer layer has a significantly poorer moisture barrier performance than a barrier layer.

In a case where the sealing layer, for instance, includes a stack of a barrier layer and a buffer layer disposed on top of each other, stress on the barrier layer can be relaxed to an extent. Merely disposing a buffer layer on a barrier layer, however, cannot sufficiently relax stress on a layer below the sealing layer.

Thus, a thick barrier layer or a bending stress or thermal stress on the EL display device causes the sealing layer to peel from the EL element.

The sealing layer being peeled leads to not only a damage to the layered structure of the EL element itself, but also formation of a path through which external water or oxygen can permeate the EL element, with the result of a decrease in the reliability of the EL display device.

In a case where an EL element is to include an organic EL layer as its EL layer, such an organic EL layer is typically formed by, for example, a vapor deposition method or coating method, and an upper electrode is typically formed by a vapor deposition method. Thus, the above layers are each made of an extremely fragile film, and have significantly low adherence. Thus, the above layers tend to be peeled along an interface thereof in a case where such an interface is subjected to, for example, (i) a large stress from the sealing layer, (ii) a thermal stress due to the environmental temperature, and/or (iii) in a case where the EL display device is a flexible display, a bending stress caused when the flexible substrate has been bent.

In other words, since the upper electrode and the organic EL layer each share interfaces with adjacent layers which interfaces are low in adherence, stress on such interfaces causes the sealing layer to peel from the EL element. As the sealing layer is peeled as such, the upper electrode and the organic EL layer are also peeled as they are attached to the sealing layer.

This may result in peeling (i) between the sealing layer and the upper electrode, (ii) between the upper electrode and the EL layer, (iii) at the interfaces between the individual layers in the EL layer, and/or (iv) between the EL layer and the lower electrode.

Patent Literature 1 discloses coating a display element on an insulating substrate with a resin layer, forming a depressed portion in the resin layer along the peripheral edge of the insulating substrate so as to surround the display element, and further coating the upper surface of the resin layer (which has the depressed portion) with an inorganic layer in order to prevent entry of external oxygen or water into the display device. Patent Literature 1 also discloses that it is preferable that the insulating substrate is partially exposed at the depressed portion.

Patent Literature 1 discloses that the depressed portion extends along the peripheral edge of the insulating substrate so as to surround a display element. Allowing a sealing layer to closely adhere to the foundation as such in a region (in which the EL layer is absent) around the display region improves adhesion in such a region around the display region. This configuration, however, does not contribute to improvement in the adherence of the sealing layer in the display region, with the result of the sealing layer being peeled in the display region.

Further, Patent Literature 1 discloses forming a depressed portion only along the peripheral edge of the insulating substrate so as to surround a display element, and does not disclose forming a depressed portion in the EL element. Patent Literature 1 thus fails to solve the fundamental issue of low adherence between the sealing layer and the EL element.

The present invention has been accomplished in view of the above issue, and provides (i) an EL display device and (ii) a method for producing an EL display device in both of which layer peeling is reduced.

Solution to Problem

In order to attain the above object, an EL display device in accordance with an aspect of the present invention includes: a plurality of EL elements each including (i) a lower electrode, (ii) an upper electrode, and (iii) an EL layer disposed between the lower electrode and the upper electrode and including a light-emitting layer; and a sealing layer covering the plurality of EL elements, the EL display device having, in a non-light-emitting portion of a display region, at least one contact hole extending through at least the upper electrode and the EL layer and allowing the sealing layer to be in contact with a surface of a layer below the EL layer.

In order to attain the above object, a method in accordance with an aspect of the present invention for producing an EL display device includes the steps of: (a) forming, on a support on which a plurality of transistors covered by a protective film and a circuit including a plurality of wires are disposed, a plurality of EL elements each including (i) a lower electrode, (ii) an upper electrode, and (iii) an EL layer disposed between the lower electrode and the upper electrode and including a light-emitting layer; (b) forming, in a non-light-emitting portion of a display region, a contact hole configured to allow a sealing layer to be in contact with a surface of a layer below the EL layer; and (c) forming the sealing layer over the support in such a manner that the sealing layer covers the plurality of EL elements and thereby allowing the sealing layer to be in contact with the surface of the layer below the EL layer at the contact hole.

Advantageous Effects of Invention

An aspect of the present invention allows the sealing layer to be in contact with the surface of a layer below the EL layer at a contact hole in a non-light-emitting portion of the display region, and thereby improves the adherence of the sealing layer in the display region. This makes it possible to prevent, for example, the sealing layer from being peeled due to stress and also prevent the upper electrode, the EL layer, and the like from being peeled together with the sealing layer being peeled off. An aspect of the present invention can therefore provide (i) an EL display device and (ii) a method for producing an EL display device in both of which layer peeling is reduced.

Figure 2:
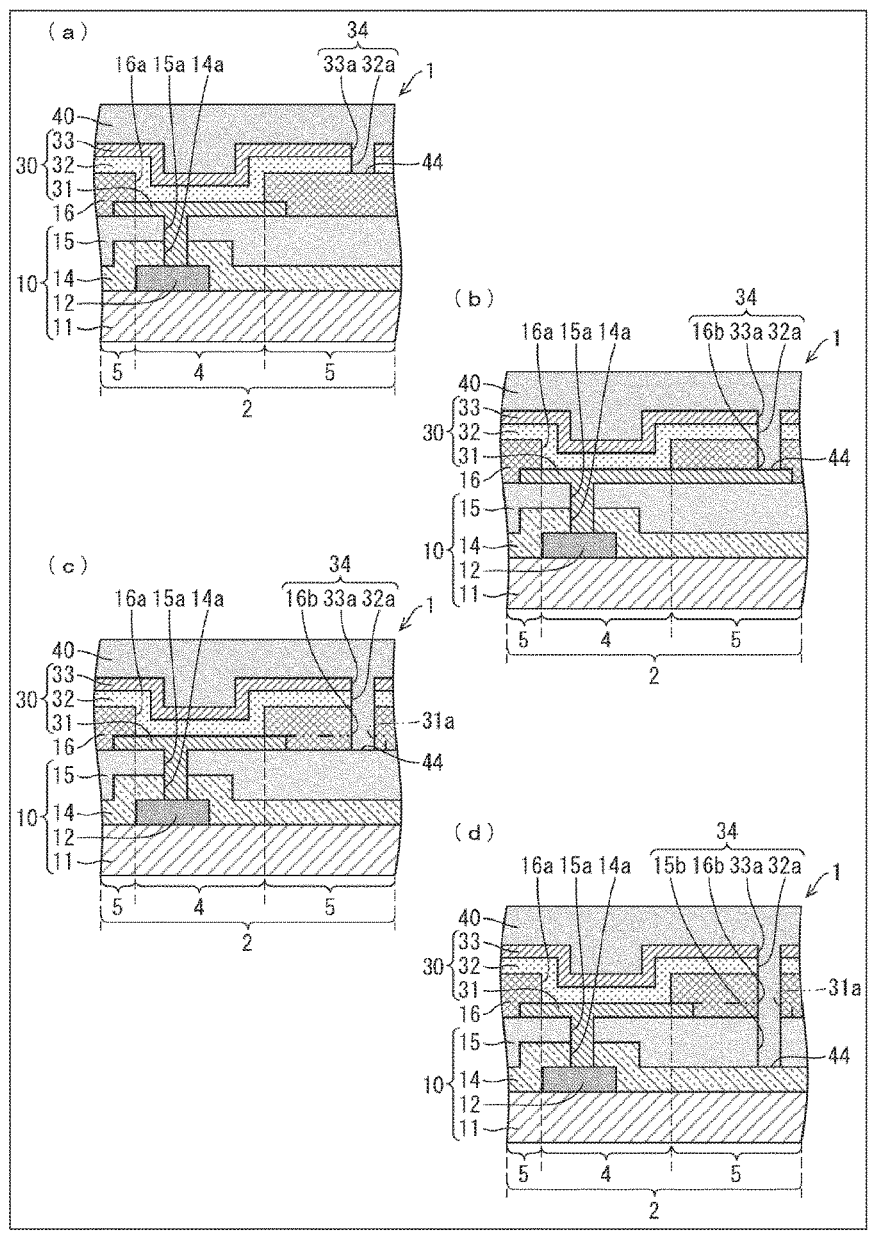

(a) to (d) of FIG. 2 are each a cross-sectional view of an organic EL display device in accordance with Embodiment 1 of the present invention, the view schematically illustrating an example of the structure of a main part of the organic EL display device.

Figure 3:
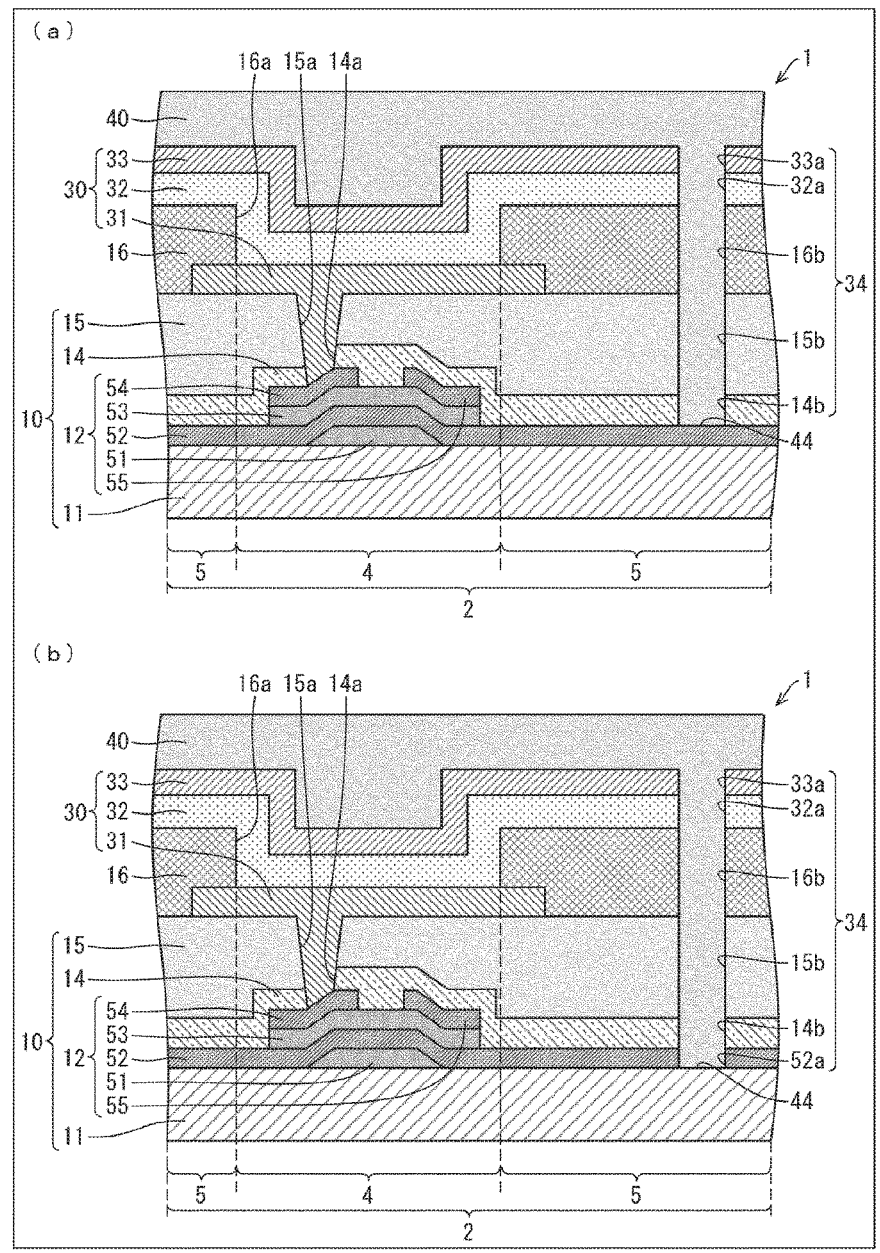

(a) and (b) of FIG. 3 are each a cross-sectional view of an organic EL display device in accordance with Embodiment 1 of the present invention, the view schematically illustrating an example of the structure of a main part of the organic EL display device.

Figure 4:
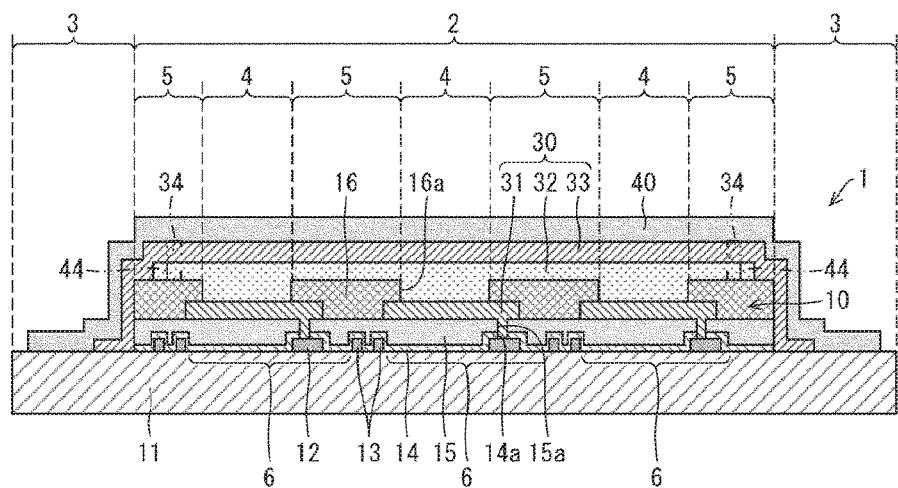

FIG. 4 is a cross-sectional view of an organic EL display device in accordance with Embodiment 1 of the present invention, the view schematically illustrating the structure of the organic EL display device.

Figure 5:
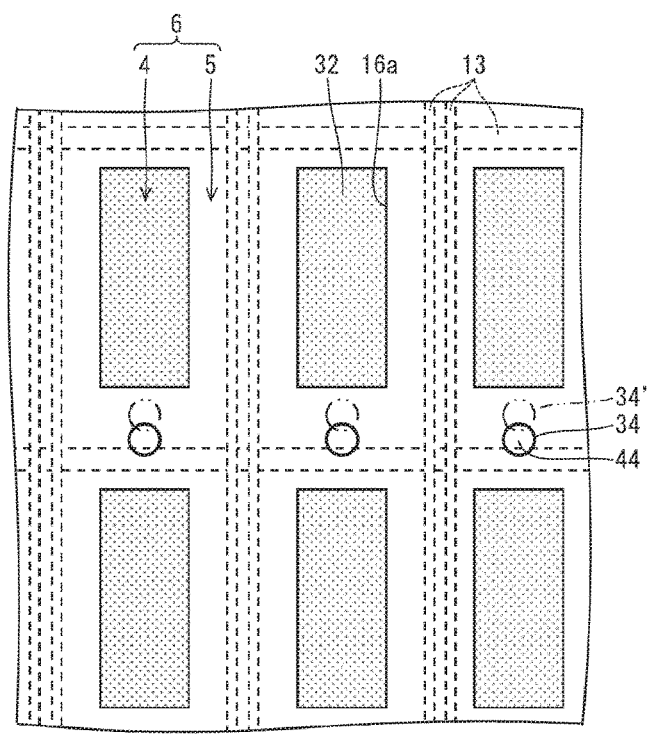

FIG. 5 is a plan view of the organic EL display device illustrated in FIG. 4, the view schematically illustrating the structure of a main part in the display region.

Figure 6:
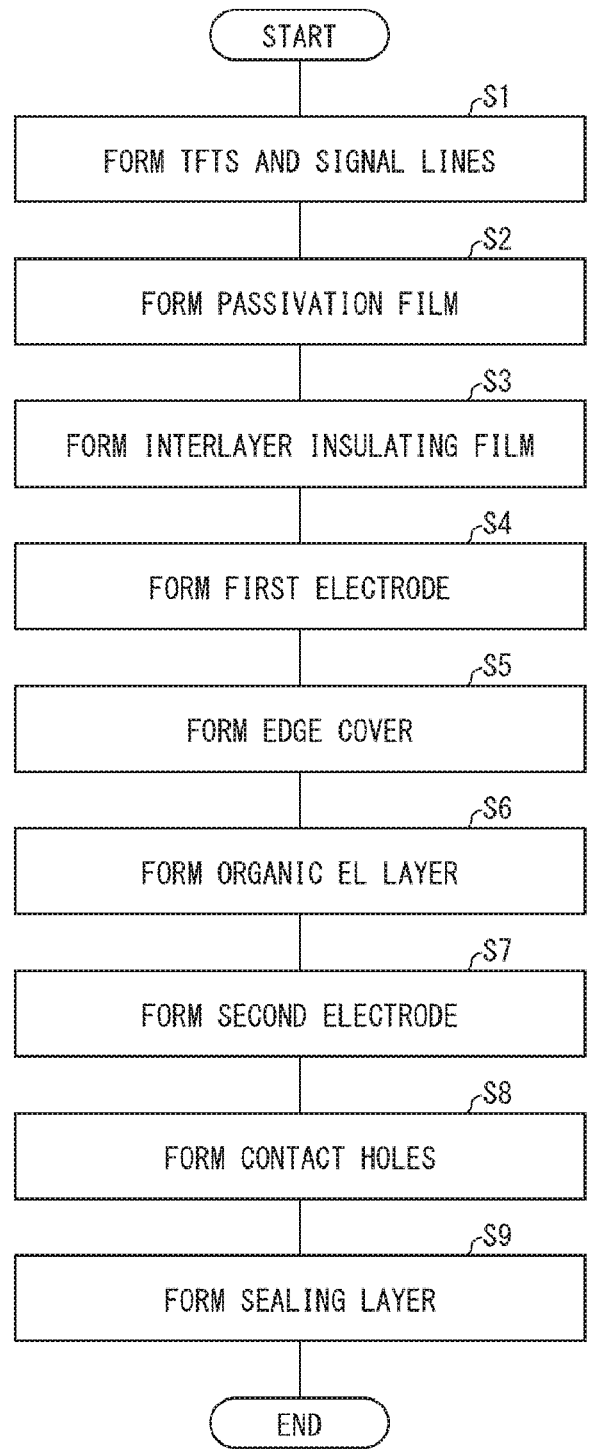

FIG. 6 is a flowchart illustrating successive steps for producing an organic EL display device in accordance with Embodiment 1 of the present invention.

Figure 7:
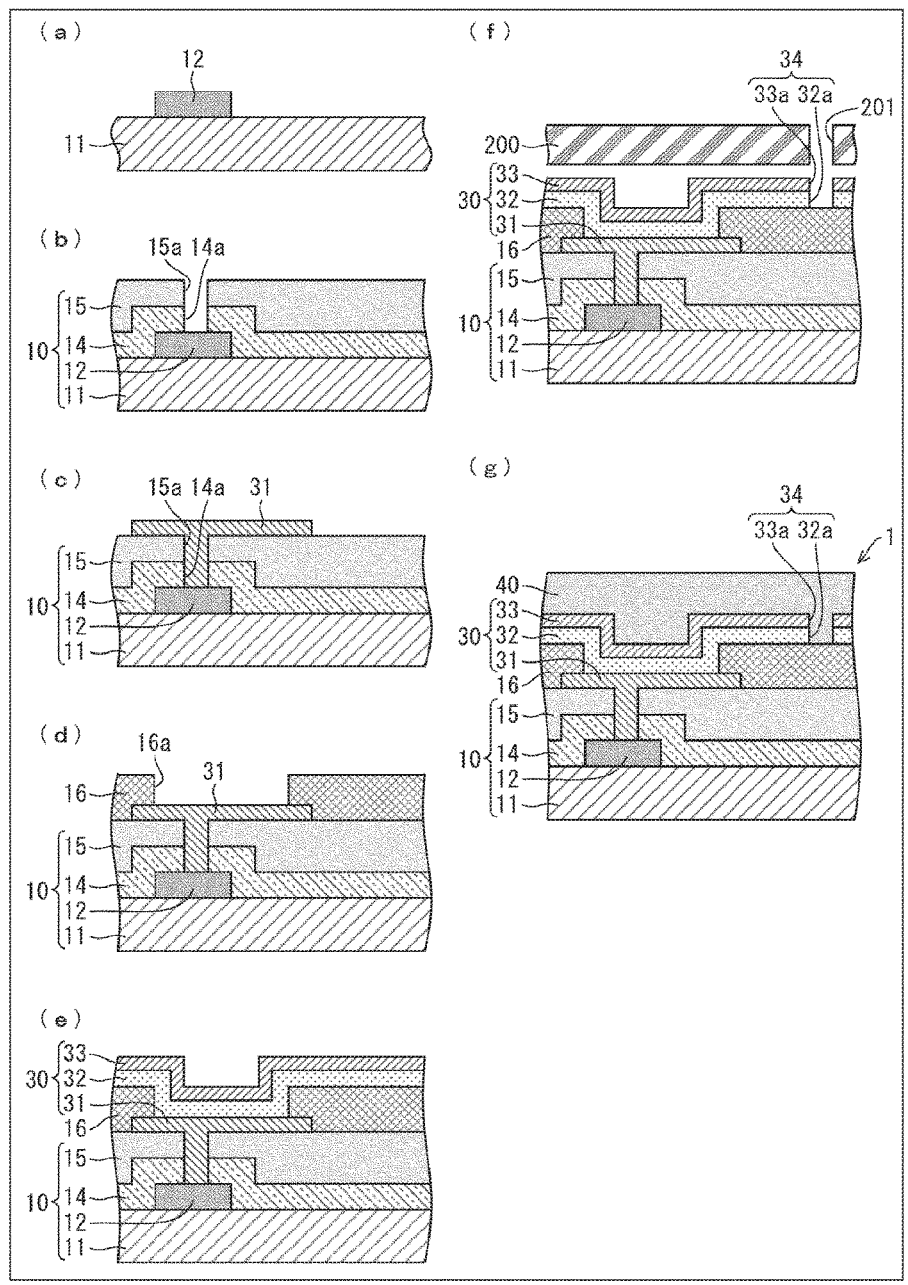

(a) to (g) of FIG. 7 are cross-sectional views illustrating successive steps for producing an organic EL display device in accordance with Embodiment 1 of the present invention.

Figure 8:
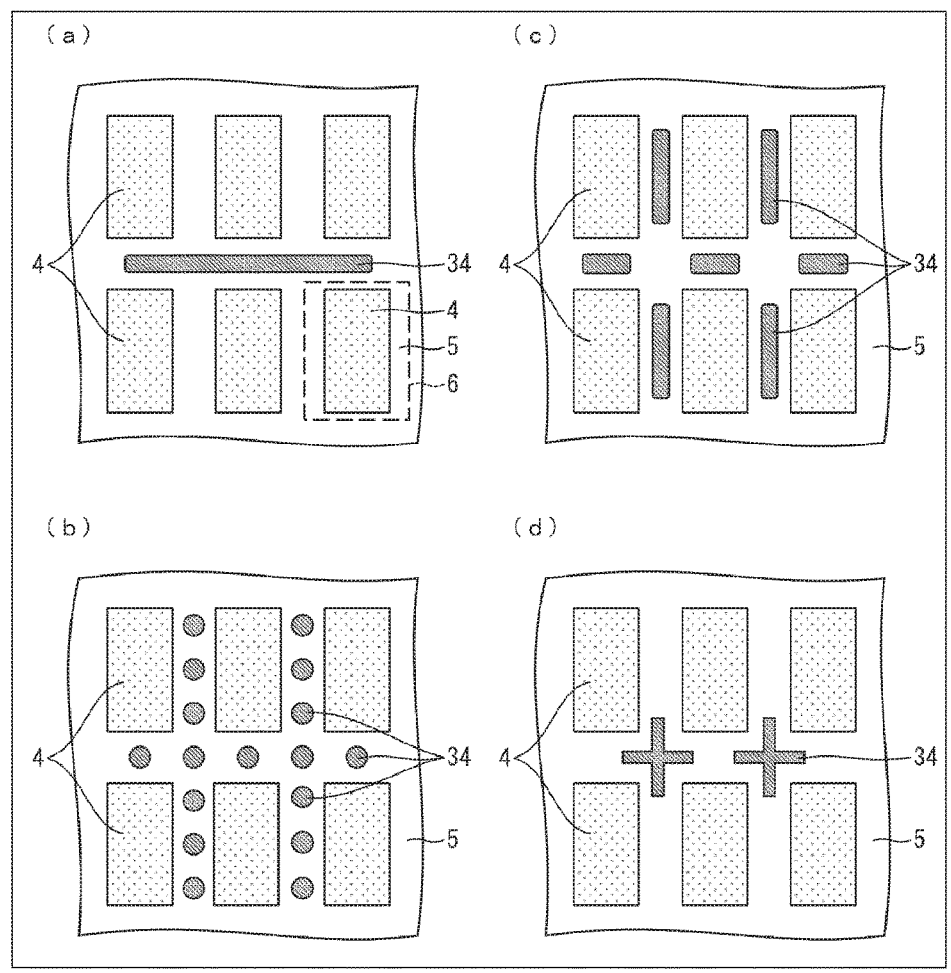

(a) to (d) of FIG. 8 are each a plan view illustrating an example shape of contact holes of an organic EL display device in accordance with Embodiment 1 of the present invention.

Figure 9:
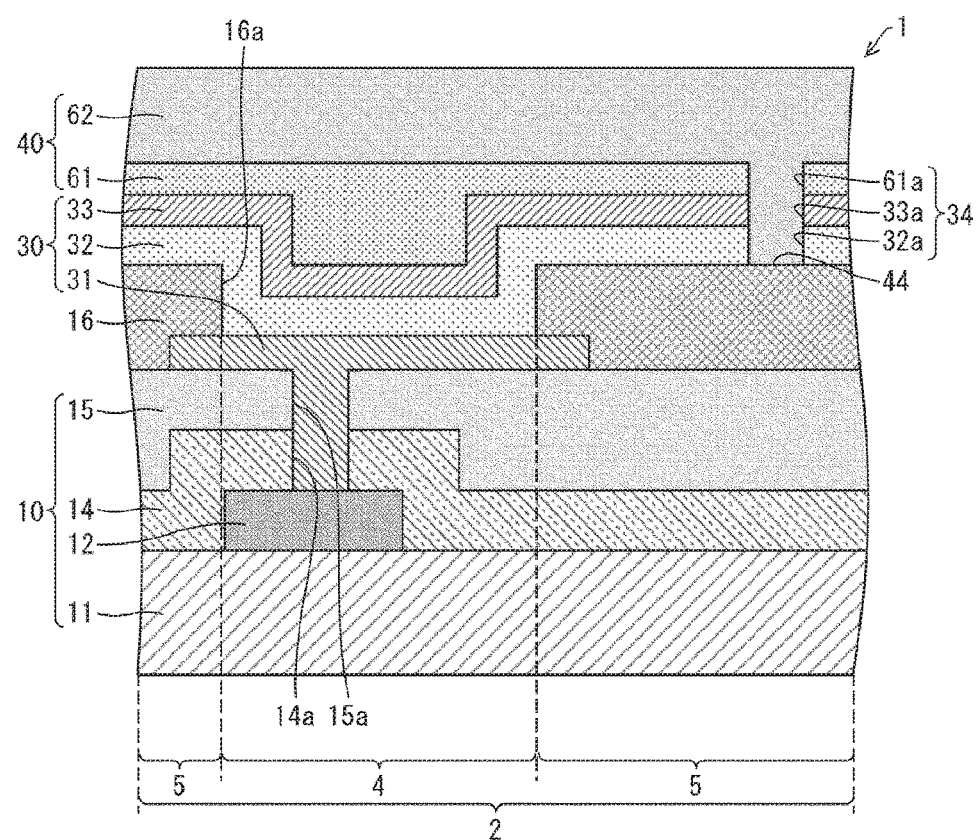

FIG. 9 is a cross-sectional view of an organic EL display device in accordance with Embodiment 2 of the present invention, the view schematically illustrating an example of the structure of a main part of the organic EL display device.

Figure 10:
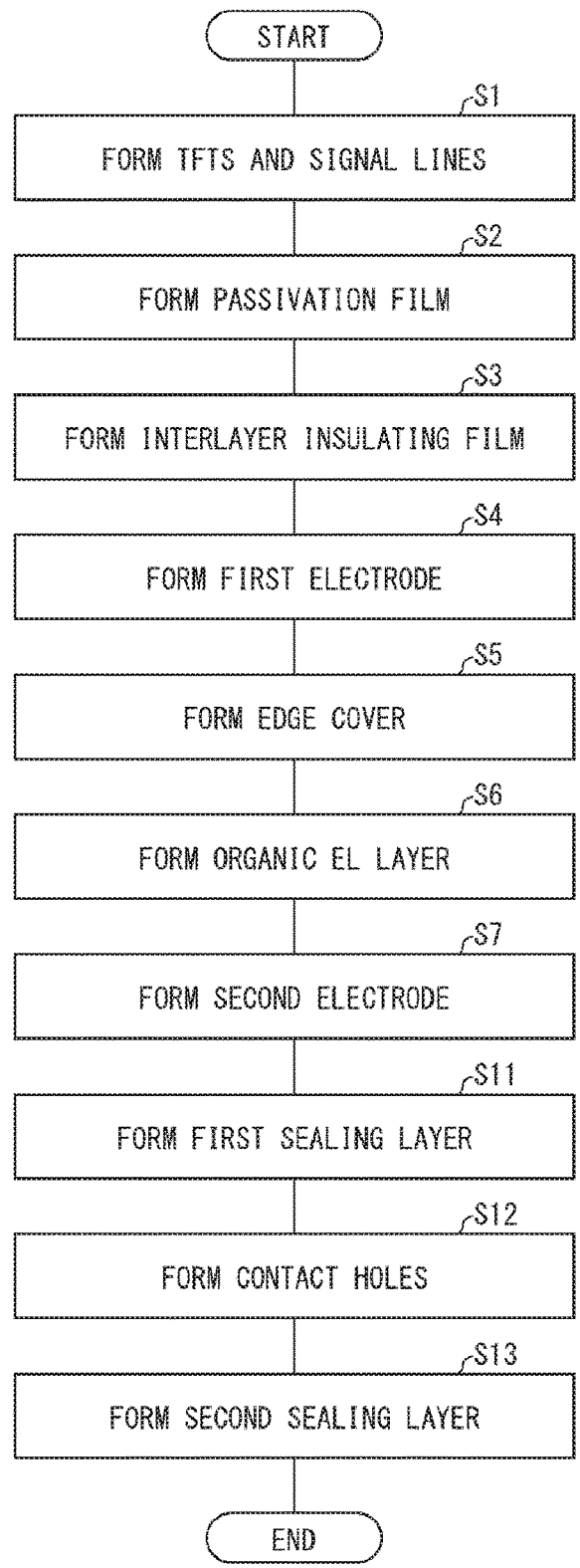

FIG. 10 is a flowchart illustrating successive steps for producing an organic EL display device in accordance with Embodiment 2 of the present invention.

Figure 11:
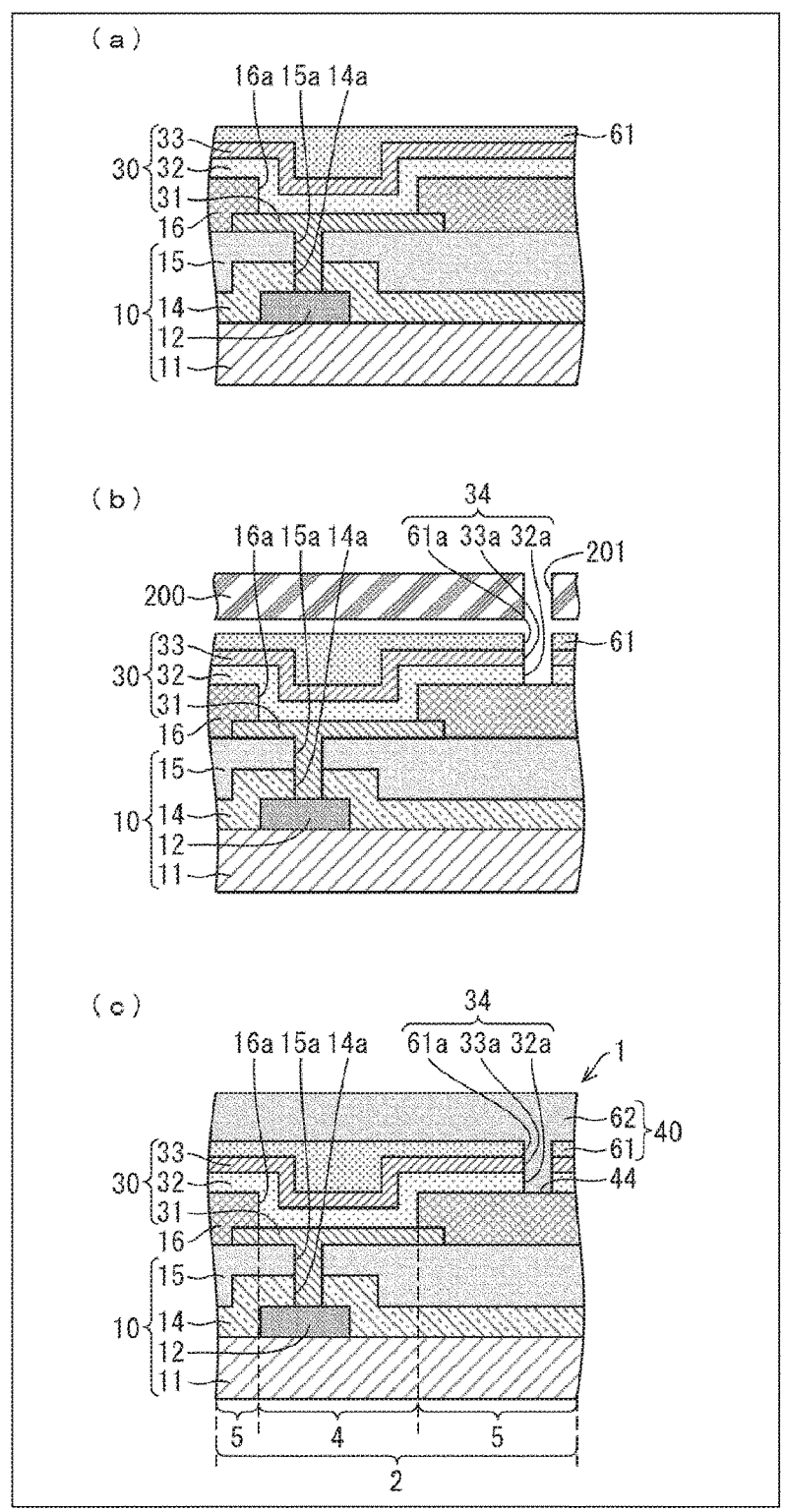

(a) to (c) of FIG. 11 are cross-sectional views illustrating part of successive steps for producing an organic EL display device in accordance with Embodiment 2 of the present invention.

Figure 12:
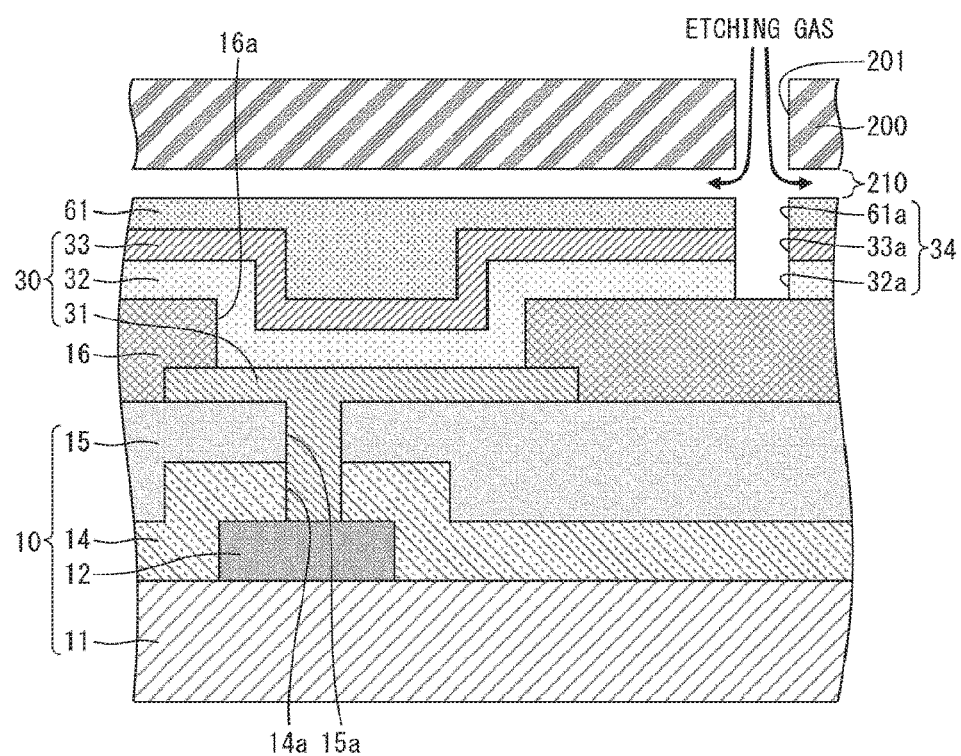

FIG. 12 is a cross-sectional view of a main part of an organic EL display device in the step illustrated in (b) of FIG. 11, the view schematically illustrating the structure of the main part.

Figure 13:
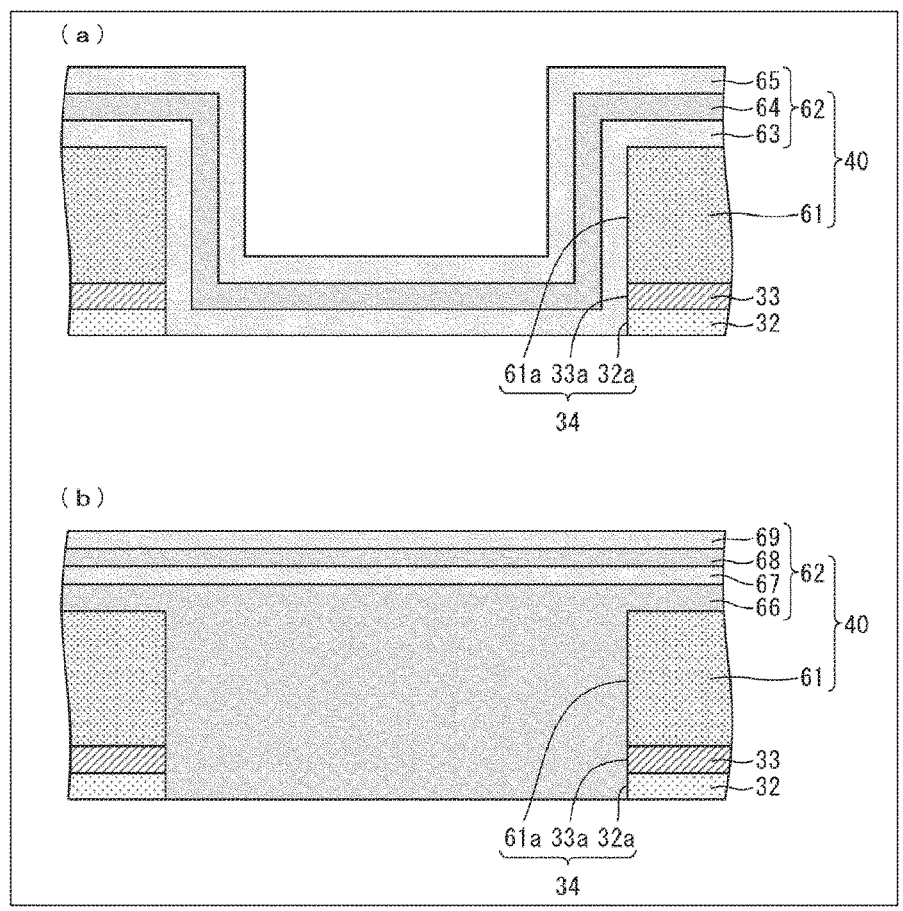

(a) and (b) of FIG. 13 are each a cross-sectional view illustrating, in an organic EL display device in accordance with Embodiment 2 of the present invention, the structure of a second sealing layer inside a contact hole for a case in which the second sealing layer has a layered structure.

Figure 14:
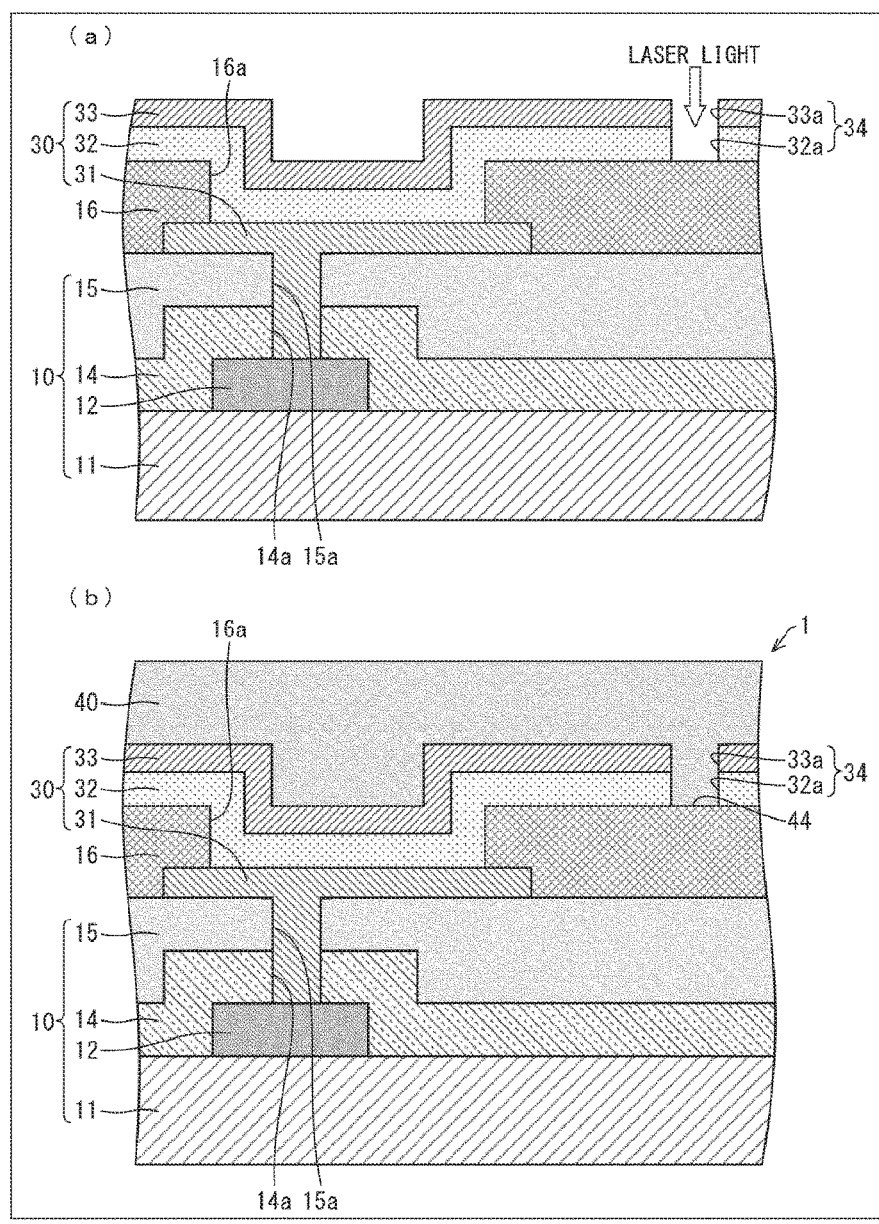

FIG. 14 shows cross-sectional views illustrating part of successive steps for producing an organic EL display device in accordance with Embodiment 3 of the present invention.

Figure 15:
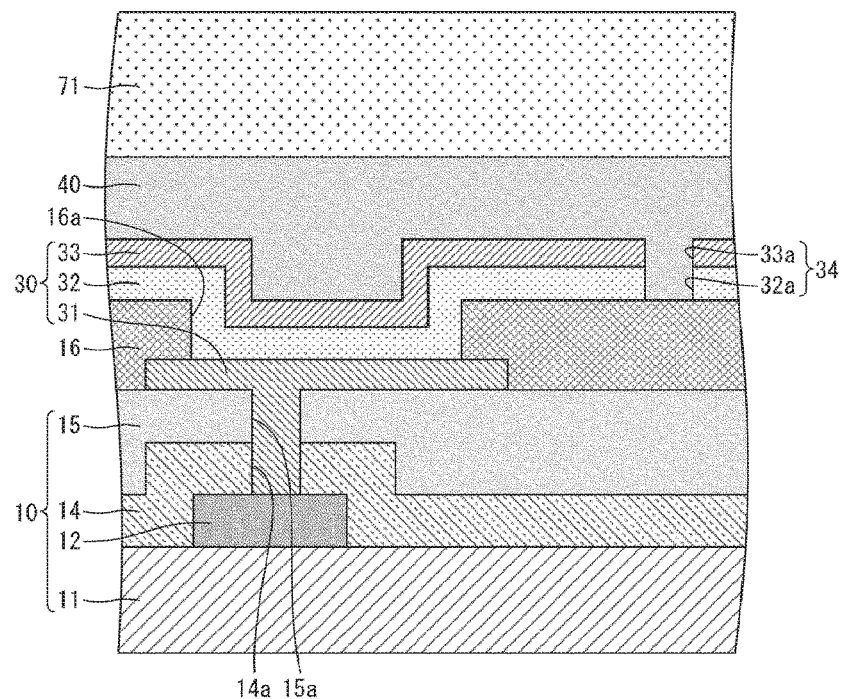

FIG. 15 is a cross-sectional view of an organic EL display device in accordance with Embodiment 4 of the present invention, the view schematically illustrating an example of the structure of a main part of the organic EL display device.

Figure 16:
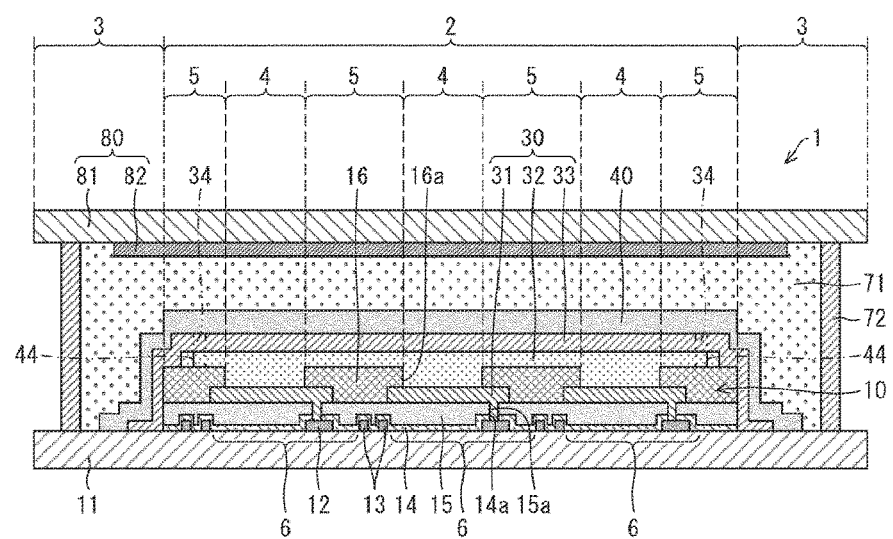

FIG. 16 is a cross-sectional view of an organic EL display device in accordance with Embodiment 4 of the present invention, the view schematically illustrating the structure of the organic EL display device.

DESCRIPTION OF EMBODIMENTS

Embodiments of the present invention are described below in detail.

Embodiment 1

An embodiment of the present invention is described below with reference to FIG. 1 to (a) through (d) of FIG. 8.

The description below deals with an organic EL display device as an EL display device in accordance with the present embodiment.

<Outline>

The description below first deals with the outline of an organic EL display device in accordance with the present embodiment with reference to FIG. 1 to (a) and (b) of FIG. 3.

Figure 1:
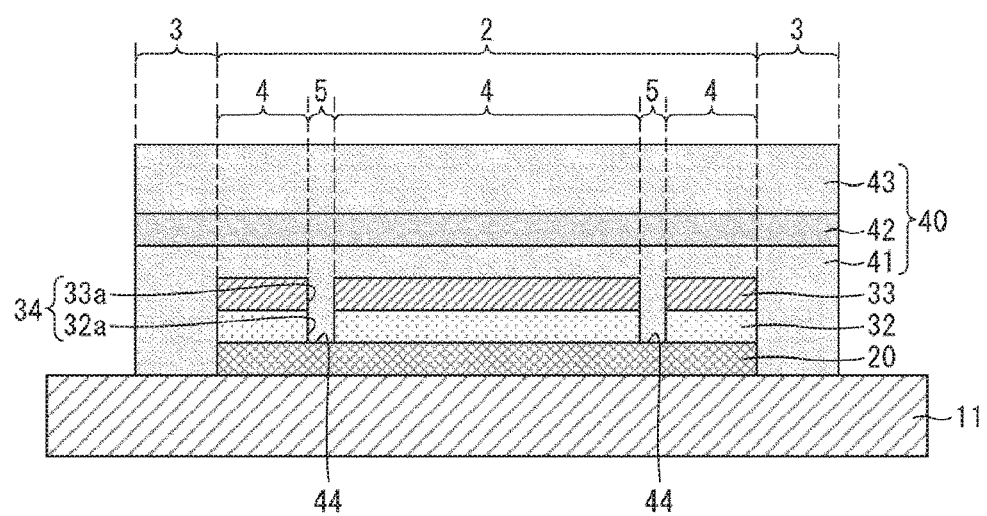
FIG. 1 is a cross-sectional view of an organic EL display device in accordance with Embodiment 1 of the present invention, the view schematically illustrating the structure of the organic EL display device.

FIG. 1 is a cross-sectional view of an organic EL display device 1 in accordance with the present embodiment, the view schematically illustrating the structure of the organic EL display device 1.

For convenience of explanation, the description below uses (i) expressions such as "below" and "back" to refer to the side on which a support 11 is present in the organic EL display device 1 and (ii) expressions such as "above" and "front" to refer to the side on which a sealing layer 40 is present in the organic EL display device 1.

As illustrated in FIG. 1, the organic EL display device 1 in accordance with the present embodiment is structured to have, in a non-light-emitting portion 5 (non-light-emitting region) of a display region 2, a plurality of contact holes 34 that allow a surface of layers 20 below an upper electrode 33 and an organic EL layer 32 (hereinafter, layers below the upper electrode 33 and the organic EL layer 32 are collectively referred to as "foundation layer") to be in contact with a sealing layer 40.

The contact holes 34 penetrate contiguous layers between the sealing layer 40 and the foundation layer 20 (which is designed to be in contact with the sealing layer 40) to allow the surface of the foundation layer 20 (which is designed to be in contact with the sealing layer 40) to be exposed. The contact holes 34 thus each include at least an opening 33a in the upper electrode 33 and an opening 32a in the organic EL layer 32, the opening 32a being connected to the opening 33a.

The contact holes 34 are each filled with the sealing layer 40. The contact holes 34 thus each have a contact portion 44 at which the sealing layer 40 is in contact with the foundation layer 20. The sealing layer 40 is in direct contact with the foundation layer 20 at the non-light-emitting portion 5 of the display region 2.

(a) to (d) of FIG. 2 and (a) and (b) of FIG. 3 are each a cross-sectional view of the organic EL display device 1 in accordance with the present embodiment, the view schematically illustrating an example structure of a main part of the organic EL display device 1. (a) to (d) of FIG. 2 and (a) and (b) of FIG. 3 each schematically illustrate the structure of a portion of the organic EL display device 1 which portion is in the vicinity of a contact hole 34.

As illustrated in (a) to (d) of FIG. 2 and (a) and (b) of FIG. 3, the foundation layer 20 (which is designed to be in direct contact with the sealing layer 40) is, for example, the edge cover 16, the lower electrode 31, the interlayer insulating film 15, the passivation film 14, the gate insulating film 52, a base coat (not shown), or the support 11.

The following description will discuss in greater detail a schematic structure of the organic EL display device 1 in accordance with the present embodiment with reference to FIGS. 4 and 5. The description below deals with, as an example, an organic EL display device of an RGB full-color display type which organic EL display device has been produced by RGB selective application.

<Schematic Structure of Organic EL Display Device>

FIG. 4 is a cross-sectional view of the organic EL display device 1 in accordance with the present embodiment, the view schematically illustrating the structure of the organic EL display device 1. FIG. 4 schematically illustrates the structure in a cross section different from that illustrated in FIG. 1. FIG. 4 schematically illustrates the structure in a cross section of the organic EL display device 1 which cross section does not cross contact holes 34 for sub-pixels 6.

FIG. 5 is a plan view (perspective view) of the organic EL display device 1 illustrated in FIG. 4, the view schematically illustrating the structure of a main part in the display region 2. FIG. 5 omits, for example, the sealing layer 40, the upper electrode 33, the lower electrode 31, and TFTs 12 for convenience of illustration.

As illustrated in FIG. 4, the organic EL display device 1 is structured such that organic EL elements 30 and the sealing layer 40 are disposed in this order on a TFT substrate 10 (element substrate, circuit board) on which a circuit (TFT circuit) has been formed that includes thin film transistors (TFTs) and wires which TFTs are used as elements such as driving transistors, control transistors, and storage capacitors. The organic EL display device 1 has (i) at a central portion thereof, a display region 2 in which to display an image and (ii) a non-display region 3 in a frame region around the display region 2. The display region 2 is a pixel region in which are arranged a plurality of pixels each including a plurality of sub-pixels 6. The organic EL elements 30 are present in the display region 2.

The organic EL elements 30 are sealed up between the TFT substrate 10 and the sealing layer 40. This prevents entry of, for example, external oxygen and water into the organic EL elements 30.

The TFT substrate 10 includes, as a base, a support 11 that supports various elements such as a plurality of TFTs 12 and organic EL elements 30.

The TFT substrate 10 includes, on the support 11, TFTs 12 (transistors; driving elements) and signal lines 13 (wires), a passivation film 14 (protective film), and an interlayer insulating film 15 (planarizing film), which are disposed in this order.

The support 11 is, for example, (i) an insulating substrate such as a glass substrate and a plastic substrate, (ii) a flexible, insulating film such as a polyimide film, (iii) an organic fiber product made of, for example, glass epoxy (produced by impregnating glass fiber with epoxy resin), (iv) an inorganic fiber product made of, for example, glass fiber or glass cloth, or (v) a metal film.

The signal lines 13 include, for example, a plurality of gate lines, a plurality of source lines, and a plurality of power supply lines. The signal lines 13 form a grid that defines square regions in which sub-pixels 6 for different colors are present. A single pixel is formed of, for example, a set of a red (R) sub-pixel 6, a green (G) sub-pixel 6, and a blue (B) sub-pixel 6.

As illustrated in FIGS. 4 and 5, each sub-pixel 6 has, as a light-emitting portion 4 (light-emitting region) for a corresponding color which light-emitting portion 4 is responsible for light emission of the sub-pixel 6, an opening 16a covered with an organic EL layer 32 including a light-emitting layer for the corresponding color. Such organic EL layers 32 are formed by vapor deposition for each color. A later description will deal with the opening 16a.

Each sub-pixel 6 includes a plurality of TFTs including TFTs 12 as driving transistors configured to supply a drive current to the corresponding organic EL element 30. As illustrated in (a) and (b) of FIG. 3, a TFT 12 includes, for example, a gate electrode 51, a gate insulating film 52, a semiconductor layer 53, and a drain electrode 54 and source electrode 55, which are disposed in this order from the side of the support 11.

The TFTs 12 may each be (i) of a bottom-gate (inversely staggered) type, with a gate electrode 51 below a semiconductor layer 53 as described above, or (ii) of a top-gate (staggered) type, with a gate electrode 51 above a semiconductor layer 53.

The TFTs 12 are each electrically connected to signal lines 13. Of all the signal lines 13, (i) gate lines are used to select sub-pixels 6 to each of which a signal is to be inputted, (ii) source lines are used to determine the magnitude (electric charge amount) of each signal to be inputted to a selected sub-pixel 6, and (iii) power supply lines are used to flow electric currents to organic EL elements 30. Adjusting the light emission intensity of each pixel allows the organic EL display device 1 to display a screen.

The respective surfaces of the TFTs 12 and signal lines 13 are covered by a passivation film 14 for protecting the TFTs 12 and the signal lines 13 for prevention of peeling of any metal film included in the TFTs 12 and the signal lines 13. The organic EL display device 1 also includes an interlayer insulating film 15 on the passivation film 14 as a planarizing film for eliminating the differences in level that are caused by and above the TFTs 12 and the signal lines 13.

The passivation film 14 is, for example, an inorganic insulating film made of silicon nitride or silicon oxide. The interlayer insulating film 15 is, for example, an organic insulating film made of acrylic resin or polyimide resin. The passivation film 14 and the interlayer insulating film 15 are each disposed above the support 11 and over that portion of the support 11 which corresponds to the entire display region 2 so as to cover the TFTs 12 and the signal lines 13.

The organic EL elements 30 are each a light-emitting element capable of emitting high-luminance light on the basis of low-voltage direct-current driving. The organic EL elements 30 each include, for example, (i) a lower electrode 31 as a bottom electrode, (ii) an organic EL layer 32 including at least a light-emitting layer, and (iii) an upper electrode 33 as a top electrode.

The lower electrode 31, the organic EL layer 32, and the upper electrode 33 are disposed in this order from the side of the TFT substrate 10. The description of the present embodiment uses the term "organic EL layer 32" to collectively refer to all the layers between the lower electrode 31 and the upper electrode 33.

The organic EL display device 1 may further include, on the upper electrode 33, an optical adjustment layer for optical adjustment and/or an electrode protection layer for electrode protection. The description of the present embodiment uses the term "organic EL element 30" to collectively refer to the following layers for each sub-pixel 6: an organic EL layer 32, electrode layers (namely, the lower electrode 31 and the upper electrode 33), and an optical adjustment layer and/or electrode protection layer (not shown in the drawings) formed according to need.

The lower electrode 31 is disposed on the interlayer insulating film 15. The lower electrode 31 injects (supplies) positive holes (holes) into the organic EL layer 32, whereas the upper electrode 33 injects electrons into the organic EL layer 32.

Positive holes and electrons injected into the organic EL layer 32 are recombined in the organic EL layer 32 to form excitons. These excitons emit light when becoming inactive from an excited state to the ground state, the light being then emitted from each organic EL element 30.

The lower electrode 31 is electrically connected to each TFT 12 via a contact hole 14a in the passivation film 14 and a contact hole 15a in the interlayer insulating film 15. The TFTs 12 are each electrically connected to signal lines 13 via a gate electrode 51 and a source electrode 55.

As illustrated in FIG. 4, the lower electrode 31 has a pattern of a plurality of islands each for a single sub-pixel 6, and has edge portions covered by an edge cover 16. The edge cover 16 is disposed on the interlayer insulating film 15 in such a pattern as to cover the edge portions of the lower electrode 31. The edge cover 16 is an insulating film made of, for example, a photosensitive resin. The edge cover 16 serves, at the edge portions of the lower electrode 31, to prevent (i) electrode concentration and/or (ii) a short circuit caused between the lower electrode 31 and the upper electrode 33 at a thin portion of the organic EL layer 32. The edge cover 16 also functions as a pixel separating film for preventing current from flowing from a sub-pixel 6 into an adjacent sub-pixel 6.

The edge cover 16 has a plurality of openings 16a each for a single sub-pixel 6. As illustrated in FIGS. 4 and 5, each opening 16a allows a portion of the lower electrode 31 and a portion of the organic EL layer 32 to be exposed to each other, thereby defining a light-emitting portion 4 of the sub-pixel 6. That region of the display region 2 which is other than the light-emitting portions 4, that is, the region covered by the edge cover 16, corresponds to a non-light-emitting portion 5.

The organic EL layer 32 includes, for example, a hole injection layer, a hole transfer layer, a light-emitting layer, an electron transfer layer, and an electron injection layer disposed in this order from the side of the lower electrode 31. A single layer may have a plurality of functions. For instance, the hole injection layer and the hole transfer layer may be replaced with a hole injection layer/hole transfer layer having both of the respective functions of the hole injection layer and hole transfer layer. Further, the electron injection layer and the electron transfer layer may be replaced with an electron injection layer/electron transfer layer having both of the respective functions of the electron injection layer and electron transfer layer. The organic EL layer 32 may further include a carrier blocking layer between the individual layers as appropriate.

The upper electrode 33 is typically disposed over the entire display region 2 as illustrated in FIG. 4. In a case where the upper electrode 33 is connected to signal lines 13 via, for example, auxiliary wires (not shown in the drawings), the upper electrode 33 may have a pattern of a plurality of islands each for a single sub-pixel 6.

FIG. 4 illustrates the lower electrode 31 as a positive electrode (pattern electrode; pixel electrode) and the upper electrode 33 as a negative electrode (common electrode). This may be varied such that the lower electrode 31 is a negative electrode and the upper electrode 33 is a positive electrode. In this case, however, the individual layers included in the organic EL layer 32 are arranged in the reverse order.

In a case where the organic EL display device 1 is of a bottom emission type (with which light is emitted from the side of the back surface of the support 11), the upper electrode 33 is a reflective electrode made of a reflective electrode material, whereas the lower electrode 31 is a transparent or semitransparent electrode made of a transparent or semitransparent light-transmitting electrode material.

In a case where the organic EL display device 1 is of a top emission type (with which light is emitted from the side of the sealing layer 40), the electrode structure is reversed from that for a bottom emission type. Specifically, in a case where the organic EL display device 1 is of a top emission type, the lower electrode 31 is a reflective electrode, whereas the upper electrode 33 is a transparent or semitransparent electrode.

The sealing layer 40 is, as illustrated in FIG. 4, disposed on the upper electrode 33 to cover, for example, the upper electrode 33, the organic EL layer 32, the edge cover 16, the interlayer insulating film 15, and the passivation film 14. The upper electrode 33 and the sealing layer 40 may, as described earlier, alternatively be separated by an organic layer (resin layer) or inorganic layer (not shown in the drawings) such as an optical adjustment layer and an electrode protection layer.

<Sealing Layer 40>

The following description will discuss the sealing layer 40 in greater detail.

The sealing layer 40 serves to prevent, for example, external water and oxygen that have entered the sealing layer 40 from degrading the organic EL elements 30.

The sealing layer 40 includes, for example, (i) a barrier layer or (ii) a film of a stack of a barrier layer and a buffer layer. As illustrated in FIG. 1, the sealing layer 40 has a layered structure including, for example, a first barrier layer 41, a buffer layer 42, and a second barrier layer 43, which are disposed in this order from the side of the upper electrode 33.

The first barrier layer 41 and the second barrier layer 43 are each an inorganic layer (inorganic insulating layer), and each have a moisture barrier function, that is, a function of preventing entry of water in order to prevent, for example, water and oxygen from degrading the organic EL elements 30.

The buffer layer 42 (stress relaxation layer) is an organic layer (organic insulating layer; resin layer), and serves to (i) relax a large membrane stress on the barrier layers, (ii) planarize (render horizontal) the respective surfaces of the organic EL elements 30 by bridging the differences in level, (iii) cover a pinhole, and/or (iv) prevent a crack in and peeling of the inorganic layer when it is being disposed.

The above layered structure is, however, a mere example. The sealing layer 40 is not limited to the above three-layer structure (including the first barrier layer 41, the buffer layer 42, and the second barrier layer 43). The sealing layer 40 may include only a barrier layer or have a layered structure including two or four or more buffer and barrier layers. The sealing layer 40 may, in other words, include only an inorganic layer or have a layered structure including organic and inorganic layers.

The above organic layer is made of, for example, an organic insulating material (resin material) such as polysiloxane, silicon oxycarbide (SiOC), acrylate, polyurea, parylene, polyimide, and polyamide.

The inorganic layer is made of, for example, an inorganic insulating material such as silicon nitride, silicon oxide, silicon oxynitride, and $Al_2O_3$.

The sealing layer 40 is in direct contact with a surface of the foundation layer 20 (that is, the layer below the upper electrode 33 and the organic EL layer 32) at the contact portion 44 in each contact hole 34.

For convenience of illustration, FIG. 1 illustrates only the first barrier layer 41 being present in the contact holes 34. However, in a case where the sealing layer 40 has a layered structure and no planarizing process is carried out for the contact holes 34, the sealing layer 40 basically has a layered structure in the contact holes 34 as well. In a case where, for example, the buffer layer 42 has a low fluidity, the first barrier layer 41, the buffer layer 42, and the second barrier layer 43 are each so shaped as to fill the contact holes 34.

The structure of the sealing layer 40 inside the contact holes 34 is, however, not limited to the above. For instance, a buffer layer with a high fluidity can be disposed in the contact holes 34 for planarization. The sealing layer 40 may, for instance, be structured to further include, as a first buffer layer, a buffer layer (not shown in the drawings) having a high fluidity below the first barrier layer 41 such that (i) the contact holes 34 are filled with the first buffer layer and that (ii) the first barrier layer 41, the buffer layer 42, and the second barrier layer 43 are disposed in this order on the first buffer layer.

Filling the contact holes 34 for planarization as above can relax stress concentration arising from the difference in level of each contact hole 34. This can in turn further reduce peeling of the sealing layer 40 caused by residual stress.

The sealing layer 40 should preferably have a barrier layer on the front surface such as the second barrier layer 43 illustrated in FIG. 1 so that the surface of the sealing layer 40 has a barrier property.

In a case where the organic EL display device 1 includes an adhesive layer and/or filler layer (not shown in the drawings) on the front surface of the sealing layer 40, the sealing layer 40 may have a buffer layer on the front surface for improved adherence to such layers. In this case, the buffer layer functions merely as an adherence improving layer.

The foundation layer 20 is typically formed during a TFT process, and has a secured adherence to the support 11 and/or an adjacent layer at the interface during the process. The foundation layer 20 thus has a secured adherence to both an organic layer and an inorganic layer. That layer included in the sealing layer 40 which is in direct contact with the foundation layer 20 may be an organic layer or an inorganic layer, that is, a buffer layer or a barrier layer.

<Contact Hole 34>

The description below now deals with the contact holes 34. The contact holes 34 are, as described earlier, present in the non-light-emitting portion 5 of the display region 2. The contact holes 34 may be positioned anywhere in the non-light-emitting portion 5 as long as the design rules permit. For further improved adherence between the sealing layer 40 and the foundation layer 20, contact holes 34 may be formed not only in a non-light-emitting portion 5 in each sub-pixel 6, but also in a non-light-emitting portion 5 along the periphery of the display region 2 as shown in FIG. 4 with chain double-dashed lines.

For improved adherence between the sealing layer 40 and the foundation layer 20, the sealing layer 40 and the foundation layer 20 should desirably be in contact with each other by as large an area as possible.

In a case where contact holes 34 to be formed are large in diameter and near the light-emitting portion 4 (light-emitting region), forming (for example, etching) such contact holes 34 may damage the upper electrode 33 and organic EL layer 32 in the light-emitting portion 4.

Thus, contact holes 34 should desirably be formed as far away as possible from the light-emitting portion 4 as long as the hole size permits.

Contact holes 34 may be formed in a non-light-emitting portion 5 between the signal lines 13 and the light-emitting portion 4 (see contact holes 34' shown in FIG. 5 with chain double-dashed lines). However, in a case where contact holes 34' are formed in a non-light-emitting portion 5 between the signal lines 13 and the light-emitting portion 4, the light-emitting portion 4 may, depending on the size of the contact holes 34', have a limited size in order to secure a region for formation of the contact holes 34', with the result of a decreased aperture ratio.

In view of the above, contact holes 34 may be formed directly above signal lines 13 in such a manner as to overlap with those signal lines 13 in a plan view as shown in FIG. 5 with solid lines, as long as the contact holes 34 do not expose the signal lines 13. In terms of aperture ratio, the contact holes 34 should desirably overlap with signal lines 13 in a plan view.

As illustrated in FIG. 4, the signal lines 13 are positioned below the passivation film 14. Thus, in a case where a contact hole 34 formed to have a largest possible depth does not reach the passivation film 14 (more precisely, reaches only the front surface of the passivation film 14), the signal lines 13 will not be exposed. This indicates that contact holes 34 may be formed directly above signal lines 13.

In a case where contact holes 34 are, for example, formed in a region between the signal lines 13 and the light-emitting portion 4 as shown in FIG. 5 with chain double-dashed lines, the contact holes 34 extend through the passivation film 14 as well, which allows the sealing layer 40 to be in contact with the front surface of a layer below the passivation film.

The passivation film 14 covers the respective surfaces of the TFTs 12 and signal lines 13. In view of that, in a case where contact holes 34 are to be formed in such a manner as to extend through the passivation film 14, those contact holes 34 are each formed at a position away from the signal lines 13. This means that a layer below the passivation film with which the sealing layer 40 is to be in contact is a layer below the signal lines 13.

Such a layer below the passivation film 14 (in other words, below the signal lines 13) with which the sealing layer 40 is to be in contact is, for example, the gate insulating film 52 or the support 11 as illustrated in (a) and (b) of FIG. 3.

The organic EL display device 1 may include, as necessary on the support 11, an insulating layer (not shown in the drawings) called base coat in order to (i) prevent impurities from being diffused from the support 11 (which is, for example, an insulating substrate) into the TFTs 12 and (ii) in a case where the support 11 is, for example, a plastic substrate, reduce water absorption by the support 11.

Thus, in a case where the organic EL display device 1 includes a base coat on the support 11 as above, the layer below the passivation film 14 with which the sealing layer 40 is to be in contact may be the base coat.

The base coat is, for example, (i) an inorganic insulating film made of a material such as silicon nitride and silicon oxide or (ii) an organic insulating film made of a material such as polyimide resin, according to the purpose of use.

In the case where holes are formed in the passivation film 14 as above so that the sealing layer 40 is in contact with the front surface of a layer below the signal lines 13, the aperture ratio may be decreased.

In view of the above, although the foundation layer 20 with which the sealing layer 40 is to be in direct contact may be a layer below the signal lines 13, the foundation layer 20 should preferably be a layer above the signal lines 13, specifically the edge cover 16, the lower electrode 31, the interlayer insulating film 15, or the passivation film 14.

As described earlier, the contact holes 34 penetrate contiguous layers between the sealing layer 40 and the foundation layer 20 (which is designed to be in contact with the sealing layer 40). Thus, the contact holes 34 (more precisely, openings that define the contact holes 34) can penetrate not only the upper electrode 33 and the organic EL layer 32, but also the edge cover 16, the lower electrode 31, the interlayer insulating film 15, the passivation film 14, and the like.

In a case where the upper electrode 33 and the sealing layer 40 are separated by, for example, an optical adjustment layer and/or electrode protection layer, it is needless to say that the contact holes 34 extend through such layers (in other words, openings that define the contact holes 34 are formed in such layers).

The size and number of the contact holes 34 and the total opening area of the contact holes 34 are not particularly limited. As described earlier, for improved adherence between the sealing layer 40 and the foundation layer 20, the sealing layer 40 and the foundation layer 20 should desirably be in contact with each other by as large an area as possible. Thus, in terms of adherence between the sealing layer 40 and the foundation layer 20, the size and number of the contact holes 34 and the total opening area of the contact holes 34 should desirably be as large as possible.

However, as described earlier, the upper electrode 33 is typically disposed over the entire display region 2. As described earlier, in a case where the upper electrode 33 is connected to signal lines 13 via, for example, auxiliary wires (not shown in the drawings), the upper electrode 33 may have a pattern of a plurality of islands each for a single sub-pixel 6.

Thus, in a case where, for instance, contact holes 34 are formed in such a pattern as to surround the light-emitting portions 4 with secured electric conductivity for the upper electrode 33, the electric conductivity path of the upper electrode 33 is reduced, with the possible result of an increased electric resistance. An increased electric resistance leads to, for example, a non-uniform luminance distribution within the display region 2 and/or an increased power consumption. Thus, the number and area of the contact holes 34 should desirably be large as long as the design permits, while the above point is in consideration.

The shape of the contact holes 34 is not limited to any particular one. In a case where the shape of the contact holes 34 is a rectangle, however, stress may be concentrated on the sealing layer 40 at the corners of the rectangle and lead to peeling of the sealing layer 40. The shape of the contact holes 34 should thus preferably have no corner, for example, a circle as illustrated in FIG. 5. The circle may be an ellipse other than a perfect circle.

<Method for Producing Organic EL Display Device 1>

With reference to FIG. 6 and (a) to (g) of FIG. 7, the description below deals with a method for producing the organic EL display device 1.

FIG. 6 is a flowchart illustrating successive steps for producing the organic EL display device 1 in accordance with the present embodiment. (a) to (g) of FIG. 7 are cross-sectional views illustrating successive steps for producing the organic EL display device 1 in accordance with the present embodiment.

(a) to (g) of FIG. 7 illustrate an example case in which contact holes 34 are formed in the upper electrode 33 and the organic EL layer 32 in the step S8 shown in FIG. 6 so that the sealing layer 40 is in contact with the front surface of the edge cover 16 as illustrated in (a) of FIG. 2.

First, as illustrated in FIG. 6 and (a) of FIG. 7, components such as TFTs 12 and signal lines 13 (not shown; see FIGS. 4 and 5) are formed on a support 11 by a publicly known method (step S1).

Next, as illustrated in FIG. 6 and (b) to (d) of FIG. 7, a normal TFT process is carried out to form a passivation film 14, an interlayer insulating film 15, a lower electrode 31 and an edge cover 16 in this order (steps S2 to S5).

Specifically, as illustrated in (b) of FIG. 7, an inorganic insulating film of a material such as silicon nitride is formed on the support 11 as a passivation film 14 by a method such as chemical vapor deposition (CVD) method in such a manner as to cover the TFTs 12 and the signal lines 13 (not shown) (step S2).

In this step, a passivation film 14 is formed in such a pattern as to, for example, cover (i) the drain electrode 54 and source electrode 55 of each TFT 12, which are present on a gate insulating film 52 on the support 11, and (ii) the signal lines 13.

Next, a film of an interlayer insulating film material (photosensitive resin material) is formed on the passivation film 14 by a method such as spin coating method. A pattern is formed on the resulting film by photolithography, and is then etched. This forms an interlayer insulating film 15 (step S3).

In this step, contact holes 14a are formed in the passivation film 14, and contact holes 15a are formed in the interlayer insulating film 15 so that a lower electrode 31 to be formed will be electrically connected to the TFTs 12.

Subsequently, as illustrated in (c) of FIG. 7, a lower electrode 31 is formed on the interlayer insulating film 15 (step S4). The lower electrode 31 is formed by, for example, (i) forming an electrically conductive film (electrode film) on the interlayer insulating film 15, (ii) applying a photoresist to the electrically conductive film, (iii) forming a pattern on the electrically conductive film by photolithography, (iv) etching the pattern, and (v) stripping the photoresist. The electrically conductive film may be disposed by, for example, sputtering method, vacuum deposition method, CVD method, plasma CVD method, or printing method.

Next, as illustrated in (d) of FIG. 7, a pattern for an edge cover 16 is formed similarly to the interlayer insulating film 15 to cover the edge portions of the pattern of the lower electrode 31. The edge cover 16 is made of an insulating material similar to that of the interlayer insulating film 15.

Carrying out the above steps prepares (i) a TFT substrate 10 and (ii) a lower electrode 31 having a pattern whose edge portions are covered by an edge cover 16.

Next, the TFT substrate 10, on which the lower electrode 31 and the edge cover 16 have been formed, is subjected to a baking treatment under reduced pressure for dehydration, and is further subjected to an oxygen plasma treatment for surface washing of the lower electrode 31.

After that, as illustrated in FIG. 6 and (e) of FIG. 7, an organic EL layer 32 and an upper electrode 33 are formed by vapor deposition method over the entire display region 2 (in which the light-emitting portion 4 and the non-light-emitting portion 5 are present). The organic EL layer 32 may be formed by a method other than vapor deposition method such as coating method (steps S6 and S7).

Specifically, first, an organic EL layer 32 including a light-emitting layer is formed on the TFT substrate 10, on which the lower electrode 31 and the edge cover 16 have been formed (step S6).

The organic EL layer 32 may be formed by, for example, coating method, inkjet method, printing method, or vapor deposition method.

In this step, the light-emitting layer is formed by selective vapor deposition for each light emission color for full-color display. The present embodiment is, however, not limited to such a configuration, and may alternatively be configured to, for full-color display, combine (i) organic EL elements 30 each including a light-emitting layer that emits white (W) light and configured to emit white light with (ii) a color filter (CF) layer (not shown in the drawings) to select the color of light that each sub-pixel 6 emits. The present embodiment may further alternatively be configured to use a light-emitting layer that emits white light and have a microcavity structure for each sub-pixel 6 for full-color image display.

In a case where, for instance, a CF layer is formed or a microcavity structure is used for variation of colors of light emitted by the sub-pixels 6, there is no need for selective application of a light-emitting layer for each sub-pixel 6.

Next, an upper electrode 33 is formed by vapor deposition method over the entire display region 2 of the TFT substrate 10 in such a manner as to cover the organic EL layer 32 (step S7).

The method described above makes it possible to form, on the TFT substrate 10, organic EL elements 30 each including a lower electrode 31, an organic EL layer 32, and an upper electrode 33.

Subsequently, as illustrated in FIG. 6 and (f) of FIG. 7, a local portion of each of the upper electrode 33 and the organic EL layer 32 is etched. This forms openings 33a in the upper electrode 33 for contact holes 34 and openings 32a in the organic EL layer 32 for contact holes 34 (step S8). In this step, contact holes 34 are formed in the non-light-emitting portion 5 of the display region 2 as illustrated in (a) of FIG. 2. As described earlier, contact holes 34 may be formed in this step not only in a non-light-emitting portion 5 in each sub-pixel 6, but also in a non-light-emitting portion 5 along the periphery of the display region 2 for further improved adherence of the sealing layer 40.

Contact holes 34 may be formed by, for example, (i) mask etching involving use of a CVD device or a dry etching device (dry etcher) or (ii) laser removal.

Mask etching involving use of a CVD device or a dry etching device uses, as an etching mask, a mask 200 having openings 201 corresponding to contact holes 34 in a plan view as illustrated in (f) of FIG. 7.

The description below assumes an example case of forming contact holes 34 by mask etching involving use of a CVD device.

For mask etching involving use of a CVD device, first, the TFT substrate 10, on which the organic EL elements 30 have been formed, is placed in a chamber of the CVD device, and the mask 200 is then placed over the TFT substrate 10. Subsequently, a reactive gas in the form of a plasma is introduced as an etching gas (cleaning gas) into the chamber so that layers exposed at the openings 201 of the mask 200 are in contact with the etching gas. This causes the inorganic or organic material of each layer exposed at the openings 201 of the mask 200 to react with the etching gas and be vaporized for removal.

In a case where for mask etching involving use of a CVD device, a high-frequency voltage is applied between the upper and lower electrodes of the CVD device for excitation of the reactive gas, the upper and lower electrodes are damaged. In view of that, a remote plasma system is suitably used, in which a means of exciting a reactive gas is provided outside the chamber, and a reactive gas that has been converted into the form of a plasma outside the chamber is introduced into the chamber via the upper electrode.

The above CVD device may be a commercially available CVD device. The above etching gas may be, for example, a fluorine-based gas such as $NF_3$ or a mixed gas of $NF_3$ and $N_2O$.

In a case where, for instance, the upper electrode 33 is made of Ag, a mixed gas of $NF_3$ and $N_2O$ is suitable. For an organic layer such as the organic EL layer 32, the etching gas is suitably, for example, (i) a mixed gas of $NF_3$ and $N_2O$, (ii) $H_2$, (iii) $N_2O$, or (iv) $O_2$.

Next, as illustrated in FIG. 6 and (g) of FIG. 7, a sealing layer 40 is formed on the upper electrode 33 over the entire display region 2 in such a manner as to cover the upper electrode 33 (step S9).

The sealing layer 40 may be formed by, for example, CVD method (plasma CVD method). The present embodiment used, for formation of a sealing layer 40, (i) the same CVD device as that used for the etching of the contact holes 34 and (ii) a mask different from the mask 200 used for the etching of the contact holes 34. The above mask was a film forming mask open at only necessary portions to prevent a sealing layer 40 from being formed in a region such as an external electric wire connection section (terminal section). The sealing layer 40 may alternatively have a layered structure (layered sealing film) as illustrated in FIG. 1.

In a case where the organic EL display device 1 is a flexible organic EL display device (flexible display), the support includes, for example, a flexible resin film such as a polyimide film.

In the case where the organic EL display device 1 is a flexible organic EL display device as such, the organic EL display device 1 may be produced through a process that further includes the steps described below.

For instance, the process of producing the organic EL display device 1 may include, before the step S1, a step of forming a support 11 on a carrier substrate (that is, a rigid substrate such as a glass substrate).

In this case, the support 11 is a layer to be peeled (that is, a layer to be transferred). The carrier substrate is a temporary support (temporary support substrate) that temporarily supports the support 11.

Thus, in this case, the production process may include, after the step S9, a step of peeling, from the carrier substrate, the support 11 on which the organic EL elements 30 and the sealing layer 40 have been formed.

The support 11 is peeled from the carrier substrate by a method such as laser ablasion, that is, by irradiating the combination of the support 11 and the carrier substrate with light from the side of the carrier substrate. Peeling the support 11 from the carrier substrate as such provides a flexible organic EL display device 1.

The process of producing the organic EL display device 1 may further include, after the step S9, a step of bonding a protective film (not shown in the drawings) to the sealing layer 40 as a functional layer. In this case, the protective film is bonded suitably before the step of peeling the support 11 from the carrier substrate.

The protective film on the sealing layer 40 may be replaced with another functional layer(s) such as a polarizing plate and a touch panel. Further, the bonding of these functional films may be replaced with (i) forming of a hard coat layer or (ii) bonding of, for example, a counter substrate including a CF support that includes a flexible insulating film such as a polyimide film and a color filter (CF) disposed on the insulating film.

<Example Variation of Method for Etching Contact Holes 34>

The present embodiment is an example case in which (i) the step S8 involves use of a CVD device for etching of contact holes 34 and (ii) the etching of contact holes 34 in the step S8 is immediately followed by the forming of a sealing layer 40 in the step S9. The present embodiment is, however, not limited to such a configuration, and may be varied such that contact holes 34 are etched with use of a dry etching device capable of mask etching. This makes it possible to form high-definition contact holes 34.

Mask etching involving use of a dry etching device uses, for example, a reactive gas (etching gas), ion, or radical to etch target portions of the inorganic or organic film exposed at the openings 201 of the mask 200.

Suitable mask etching involving use of a dry etching device is reactive ion etching (RIE), which involves an etching gas in the form of a plasma for a combination of (i) a chemical reaction with the material with (ii) physical etching involving sputtering of ionized, electrically charged particles.

For mask etching involving use of a dry etching device, the etching gas is, for example, an argon (Ar)-based, fluorine (F)-based, or chlorine (Cl)-based gas. Specific examples include Ar, $CF_4$, $CHF_3$, $SF_6$, and $Cl_2$ gases.

<Example Variation of Method for Forming Sealing Layer 40>

A sealing layer 40 may alternatively be formed by a method other than CVD method such as sputtering method or atomic layer deposition (ALD) method. Among these methods, CVD method and ALD method are particularly suitable for forming a sealing layer 40 because the two methods are particularly effective in eliminating differences in level. As described earlier, the film forming mask is a mask open at only necessary portions to prevent a sealing layer 40 from being formed in a region such as an external electric wire connection section (terminal section).

In a case where the sealing layer 40 has a layered structure, (i) a barrier layer (such as a first barrier layer 41 and a second barrier layer 43) may be formed by, other than CVD method, a method such as sputtering method and ALD method, and (ii) a buffer layer (such as a buffer layer 42) may be formed by, other than CVD method, a method such as vapor deposition polymerization method or a method of depositing a precursor and then irradiating the precursor with ultraviolet (UV) light for polymerization.

In a case where barrier and buffer layers are formed by CVD method, a sealing layer 40 may be formed continuously (including etching) with use of only a CVD device. Forming barrier and buffer layers by CVD method is advantageous in terms of reducing device costs, shortening the cycle time, and preventing entry of particles.

<Example Variation of Method for Forming Contact Holes 34>

(a) to (g) of FIG. 7 illustrate an example case in which contact holes 34 are formed in the upper electrode 33 and the organic EL layer 32 in the step S8 shown in FIG. 6 so that the sealing layer 40 is in contact with the front surface of the edge cover 16 as illustrated in (a) of FIG. 2.

The present embodiment is, however, not limited to such a configuration. As illustrated in (b) to (d) of FIG. 2 and (a) and (b) of FIG. 3, the foundation layer 20 (which is designed to be in direct contact with the sealing layer 40) may, for example, be the lower electrode 31, the interlayer insulating film 15, the passivation film 14, an insulating film (such as the gate insulating film 52) present on a flat surface between the signal lines 13 and the support, or the support 11 itself.

As described earlier, the contact holes 34 extend through contiguous layers between the sealing layer 40 and the foundation layer 20 (which is designed to be in contact with the sealing layer 40). The contact holes 34 may thus extend through not only the upper electrode 33 and the organic EL layer 32, but also a layer such as the interlayer insulating film 15, the passivation film 14, and the gate insulating film 52 as illustrated in (b) to (d) of FIG. 2 and (a) and (b) of FIG. 3.

Thus, the contact holes 34 may be defined by openings 33a in the upper electrode 33 and openings 32a in the organic EL layer 32 as illustrated in (a) of FIG. 2 or by openings 33a in the upper electrode 33, openings 32a in the organic EL layer 32, and openings 16b in the edge cover 16 as illustrated in (b) and (c) of FIG. 2. Further, as illustrated in (d) of FIG. 2, the contact holes 34 may be defined by openings 33a in the upper electrode 33, openings 32a in the organic EL layer 32, openings 16b in the edge cover 16, and openings 15b in the interlayer insulating film 15. Alternatively, as illustrated in (a) of FIG. 3, the contact holes 34 may be defined by openings 33a in the upper electrode 33, openings 32a in the organic EL layer 32, openings 16b in the edge cover 16, openings 15b in the interlayer insulating film 15, and openings 14b in the passivation film 14. Further, as illustrated in (b) of FIG. 3, the contact holes 34 may be defined by openings 33a in the upper electrode 33, openings 32a in the organic EL layer 32, openings 16b in the edge cover 16, openings 15b in the interlayer insulating film 15, openings 14b in the passivation film 14, and openings 52a in the gate insulating film 52.

In a case where the foundation layer 20 (which is designed to be in direct contact with the sealing layer 40) is a layer below the lower electrode 31, the contact holes 34 (more precisely, openings that partially define the contact holes 34) can, for instance, extend through the lower electrode 31 as well, as shown in (c) and (d) of FIG. 2 with chain double-dashed lines.

In other words, the contact holes 34 may include openings 31a in the lower electrode 31 as show in (c) and (d) of FIG. 2 with chain double-dashed lines. Thus, the contact holes 34 may be defined by openings 33a, 32a, 16b, and 31a or by openings 33a, 32a, 16b, 31a, and 15b. Further, the contact holes 34 may be defined by openings 33a, 32a, 16b, 31a, 15b, and 14b or by openings 33a, 32a, 16b, 31a, 15b, 14b, and 52a.

Contact holes 34 may be formed in, for example, the lower electrode 31, the edge cover 16, the interlayer insulating film 15, the passivation film 14, and the gate insulating film 52 through a typical TFT process, that is, by carrying out photolithography with use of, for example, a photosensitive resin and a photoresist, carrying out etching, and stripping the photoresist.

In a case where openings 31a are to be formed in the lower electrode 31 for formation of contact holes 34, such openings 31a may be formed by (i) applying a photoresist in advance to the electrically conductive film, (ii) forming a pattern on the electrically conductive film by photolithography, (iii) etching the pattern, and (iv) stripping the photoresist.

<Effects>

An organic EL layer is typically formed by vapor deposition method or coating method. An upper electrode as an upper electrode is typically formed by vapor deposition method. As a result, an organic EL layer and an upper electrode each fail to be have molecules strongly bonded to each other, and are each a fragile film (in other words, the film itself is extremely easy to break). Thus, in a case where such a film has an interface with another film, that interface has a low adherence.

Conventional techniques are configured such that a sealing layer is formed on the entire upper electrode present over the entire display region. A sealing layer typically has a large thickness and a high internal stress for a sufficient sealing capability. In addition, in a case where a flexible organic EL display device or the like is bent, a bending stress is applied to each layer. Further, the environmental temperature causes a thermal stress. In a case where such stresses are applied to the interfaces of the individual layers, peeling occurs at a portion having a low adherence. In other words, the above stresses cause the sealing layer to be peeled from the TFT substrate. Further, peeling may occur at the interface between the upper electrode and the organic EL layer, at the interface(s) between the individual layers included in the organic EL layer, and/or at the interface between the organic EL layer and the lower electrode. In a case where peeling has occurred at, for example, the interface between the upper electrode and the organic EL layer, the upper electrode is peeled from the TFT substrate together with the sealing layer being peeled off.

In a case where such peeling has occurred, a damage to the layered structure of the organic EL element will degrade the light emission property and/or shorten the life. Further, external oxygen and water, for example, enter the void resulting from the peeling, thereby degrading the organic EL display device further and decreasing its reliability.

In contrast, the present embodiment is configured such that the sealing layer 40 and the foundation layer 20 (such as the edge cover 16) are in tight contact with each other via contact holes 34 in the non-light-emitting portion 5 of the display region 2, each of which contact holes 34 includes an opening 33a in the upper electrode 33 and an opening 32a in the organic EL layer 32.

An edge cover 16 prepared through a TFT process is a strong film, and has a high adherence to the sealing layer 40 as compared to the upper electrode 33 and the organic EL layer 32.

While an upper electrode 33 is formed by vapor deposition method as described above, a lower electrode 31 is formed normally by sputtering method. A deposited film formed by vapor deposition method is easily breakable and has a low adherence, while a sputtered film formed by sputtering method is hard and has a high adherence, as is understandable from the fact that sputtered films are used during a TFT process for a liquid crystal display device and the like. The layer immediately below the upper electrode 33 is an organic EL layer 32, which is easy to break and has a low adherence similarly to the upper electrode 33, while the layer immediately below the lower electrode 31 is, for example, an interlayer insulating film 15 formed through a TFT process. The layer below the lower electrode 31 is thus also stronger than the layer below the upper electrode 33. Thus, causing the sealing layer 40 to be in tight contact with the lower electrode 31 can improve the adherence of the sealing layer 40.

Not only the edge cover 16, the lower electrode 31, and the like, but also the foundation layer 20 such as the interlayer insulating film 15, the passivation film 14, the gate insulating film 52, and a base coat (not shown in the drawings) has a secured adherence to the support 11 during the process or a secured adherence at the interface with an adjacent layer, as the foundation layer 20 is, for example, formed by a TFT process. Thus, causing the sealing layer 40 to be in tight contact with the foundation layer 20 can improve the adherence of the sealing layer 40.

The organic EL display device 1 in accordance with the present embodiment is thus configured such that the above stresses applied thereto do not cause the sealing layer 40 to be peeled and do not cause, for example, the upper electrode 33 or EL layer to be peeled together with the sealing layer 40 being peeled off.

The present embodiment, therefore, makes it possible to provide, as the organic EL display device 1, an organic EL display device in which the above stresses applied thereto do not cause film peeling (for example, a flexible organic EL display device in which the above stresses do not cause film peeling).

As described earlier, for a higher aperture ratio, the foundation layer 20 (which is designed to be in direct, tight contact with the sealing layer 40) should preferably be the edge cover 16, the lower electrode 31, the interlayer insulating film 15, or the passivation film 14, all of which are positioned above the signal lines 13.

In a case where the sealing layer 40 is in tight contact with each foundation layer 20 above, the sealing layer 40 can have an improved adherence in any case. The adherence between inorganic films is usually higher than that between an organic film and an inorganic film.

Thus, for an improved adherence and prevention of a decrease in the aperture ratio, the sealing layer 40 should more desirably be in direct contact with the front surface of the lower electrode 31 or passivation film 14. Further, in a case where the sealing layer 40 and the passivation film 14 are each a silicon-based inorganic film, the sealing layer 40 and the passivation film 14 have respective compositions close to each other and have a high adherence to each other. Thus, the sealing layer 40 should further desirably be in direct contact with the front surface of the passivation film 14.

The present embodiment allows the sealing layer 40 to have an improved adherence. Thus, in a case where the sealing layer 40 includes a thick layer or has a layered structure, the present embodiment allows the sealing layer 40 to have a larger thickness by, for example, including a larger number of layers therein. The present embodiment thus achieves a further improved sealing capability.

For instance, conventional sealing layers typically have a thickness of approximately 1 μm to 2 μm. The present embodiment may, in contrast, be configured such that the sealing layer 40 has a thickness of, for example, 1 μm to 20 μm at a portion other than the contact holes 34.

A typical inorganic layer having a large thickness receives a large membrane stress and thus becomes peeled easily. An inorganic layer having a small thickness, on the other hand, has a poor moisture barrier characteristic, and when being bent, tends to become cracked easily and broken easily. An organic layer, however, has a significantly poorer moisture barrier performance than an inorganic layer. Further, merely disposing an organic film and an inorganic film on top of each other cannot sufficiently relax membrane stress.

Thus, in a case where (i) the inorganic layer is thicker for an improved moisture barrier property or (ii) a bending stress or thermal stress is applied to the organic EL display device, the sealing layer may, in the case of conventional organic EL display devices, be peeled from the respective surfaces of the upper electrode and organic EL layer.

The present embodiment allows the sealing layer 40 to have an improved adherence and makes it possible to use a sealing layer 40 that is thicker than conventional. This in turn makes it possible to provide an organic EL display device 1 that is excellent in moisture barrier property and breakage endurance and that is free from film peeling.

<Example Variation of Shape of Contact Holes 34>

As described earlier, in terms of adherence between the sealing layer 40 and the foundation layer 20, the number and area of the contact holes 34 should desirably be large as long as the design permits, in view of an increase in electric resistance due to the formation of openings 33a in the upper electrode 33.

(a) to (d) of FIG. 8 are each a plan view illustrating an example shape of contact holes 34 of the organic EL display device 1 in accordance with the present embodiment. (a) to (d) of FIG. 8 omit, for example, the sealing layer 40, the upper electrode 33, the lower electrode 31, the signal lines 13, and the TFTs 12 for convenience of illustration.

(a) of FIG. 8 illustrates an example case in which a single contact hole 34 extends in the row direction along a signal line 13 (gate line; not shown) in such a manner as to be adjacent to a plurality of light-emitting portions 4 arranged in the row direction. A contact hole 34 may be present across a plurality of sub-pixels 6 (see FIG. 5) as such.

(a) of FIG. 8 illustrates an example in which a single contact hole 34 extends in the row direction in such a manner as to be adjacent to a plurality of light-emitting portions 4 arranged in the row direction. It is needless to say that a single contact hole 34 may alternatively extend in the column direction along a signal line 13 (source line; not shown) in such a manner as to be adjacent to a plurality of light-emitting portions 4 arranged in the column direction.

(b) of FIG. 8 illustrates an example case in which contact holes 34 are arranged non-continuously in such a manner as to divide individual light-emitting portions 4 arranged in a matrix. More specifically, (b) of FIG. 8 illustrates an example case in which contact holes 34 that are circular in a plan view surround individual light-emitting portions 4.

(c) of FIG. 8 illustrates an example case in which in a plan view, contact holes 34 are each present between a side of a light-emitting portion and a side of another light-emitting portion adjacent to the above light-emitting portion and each extend along those sides. In other words, this example is a case in which rectangular contact holes 34 face the sides of the individual light-emitting portions 4 (that is, opening edges of the edge cover 16).

(d) of FIG. 8 illustrates an example case in which in a plan view, cross-shaped contact holes 34 are each present at corners of individual light-emitting portions 4 arranged in a matrix (in other words, at intersections of the signal lines 13 shown in FIG. 5).

As described above, the number and area of the contact holes 34 may be changed variously in view of an increase in electric resistance.

<Example Variation of EL Display Device>

The present embodiment described here is, as described above, an organic EL display device as an example EL display device. The present invention is also applicable to an inorganic EL display device, which includes a light-emitting layer made of an inorganic material.

An inorganic EL display device includes, as EL elements, not organic EL elements 30 but inorganic EL elements, each of which includes a light-emitting layer made of an inorganic substance. An inorganic EL element includes, for example, an EL layer including a light-emitting layer and dielectric layers sandwiching the light-emitting layer as well as a lower electrode and an upper electrode that sandwich the EL layer. Thus, it is needless to say that using inorganic EL elements instead of organic EL elements 30 allows the inorganic EL display device to produce effects similar to the above.

Embodiment 2

Another embodiment of the present invention is described below with reference to FIG. 9 to (a) and (b) of FIG. 13. The description below of the present embodiment deals with how the present embodiment differs from Embodiment 1. Any member of the present embodiment that is identical in function to a member described for Embodiment 1 is assigned a common reference sign, and is not described here.

<Schematic Structure of Organic EL Display Device 1>

FIG. 9 is a cross-sectional view of an organic EL display device 1 in accordance with the present embodiment, the view schematically illustrating an example of the structure of a main part of the organic EL display device 1. FIG. 9 schematically illustrates the structure of a portion of the organic EL display device 1 which portion is in the vicinity of a contact hole 34.

The organic EL display device 1 in accordance with the present embodiment is identical to the organic EL display devices 1 in accordance with Embodiments 1 to 3 except for the points below.

The organic EL display device 1 in accordance with the present embodiment is configured as illustrated in FIG. 9 such that (i) the sealing layer 40 includes a first sealing layer 61 and a second sealing layer 62 and that (ii) the contact holes 34 extend also through the first sealing layer 61, which is disposed below the second sealing layer 62.

The present embodiment is thus configured such that (i) the first sealing layer 61, which is disposed on the upper electrode 33, has openings 61a included in the contact holes 34 and that (ii) the second sealing layer 62 is in direct contact with the foundation layer 20 via the contact holes 34.

The first sealing layer 61 may, for example, be a single barrier layer, a single buffer layer, or a combination of a barrier layer and a buffer layer disposed on top of each other.

The second sealing layer 62 may be a single barrier film or a combination of a barrier layer and a buffer layer disposed on top of each other.

The present embodiment is an example in which the foundation layer 20, which is designed to be in direct contact with the second sealing layer 62, is an edge cover 16 as illustrated in FIG. 9. However, as described for Embodiment 1, the foundation layer 20 may be any of the edge cover 16, the lower electrode 31, the interlayer insulating film 15, the passivation film 14, an insulating film (such as the gate insulating film 52) present on a flat surface between the signal lines 13 and the support, and the support 11 itself.

<Method for Producing Organic EL Display Device 1>

With reference to FIG. 10 and (a) to (c) of FIG. 11, the description below deals with a method for producing the organic EL display device 1 in accordance with the present embodiment.

FIG. 10 is a flowchart illustrating successive steps for producing the organic EL display device 1 in accordance with the present embodiment. (a) to (c) of FIG. 11 are cross-sectional views illustrating part of successive steps for producing the organic EL display device 1 in accordance with the present embodiment.

(a) to (c) of FIG. 11 illustrate the production steps S11 to S13 shown in FIG. 10. The production steps S1 to S7 of the present embodiment are identical to those of Embodiment 1, and are as illustrated in the cross-sectional views of (a) to (e) of FIG. 7. The steps S1 to S7 are thus not dealt with in the description below of the present embodiment, and not illustrated in cross-sectional views.

The present embodiment is configured such that after the steps S1 to S7 illustrated in (a) to (e) of FIG. 7, a first sealing layer 61 is formed on the upper electrode 33 over the entire display region 2 in such a manner as to cover the upper electrode 33 as illustrated in FIG. 10 and (a) of FIG. 11 (step S11).

The first sealing layer 61 may be formed by a method similar to the method described for Embodiment 1 for forming the sealing layer 40. The first sealing layer 61 for the present embodiment was formed with use of a CVD device as an example. The mask was, as in Embodiment 1, a film forming mask open at only necessary portions to prevent a sealing layer 40 (in this step, a first sealing layer 61) from being formed in a region such as an external electric wire connection section (terminal section).

Subsequently, as illustrated in FIG. 10 and (b) of FIG. 11, a local portion of each of the upper electrode 33, the organic EL layer 32, and the first sealing layer 61 is etched. This formed, as contact holes 34, openings 61a in the first sealing layer 61, openings 33a in the upper electrode 33 that are connected to the openings 61a, and openings 32a in the organic EL layer 32 that are connected to the openings 61a and 33a (step S12).

The present embodiment used the same CVD device as that used for the formation of the first sealing layer 61 to form contact holes 34. The present embodiment is, however, not limited to such a configuration, and may be varied such that as in Embodiment 1, contact holes 34 are etched by, for example, mask etching involving use of a dry etching device or by laser removal. The etching gas (cleaning gas) is as described for Embodiment 1.

The present embodiment used, as an etching mask, a mask 200 similar to that used for Embodiment 1, the mask 200 having openings 201 corresponding to contact holes 34 in a plan view as illustrated in (b) of FIG. 11. The present embodiment may also be configured such that contact holes 34 are formed in this step not only in a non-light-emitting portion 5 in each sub-pixel 6, but also in a non-light-emitting portion 5 along the periphery of the display region 2.

After the above step, a second sealing layer 62 is formed on the first sealing layer 61 over the entire display region 2 in such a manner as to cover the first sealing layer 61 as illustrated in FIG. 10 and (c) of FIG. 11 (step S13).

The second sealing layer 62 may be formed by a method similar to the method for forming the first sealing layer 61. The second sealing layer 62 for the present embodiment was formed with use of, as an example, the same CVD device as that used for the formation of the first sealing layer 61 and the etching of the contact holes 34. The film forming mask was the same mask as that used for the formation of the first sealing layer 61.

Using the same CVD device for the formation of the first sealing layer 61, the etching of the contact holes 34, and the formation of the second sealing layer 62 as above is advantageous in terms of reducing device costs, shortening the cycle time, and preventing entry of particles.

The present embodiment also may be configured such that the step S11 is followed by an additional step(s) similar to a step(s) carried out after the step S9 for Embodiment 1, for example, a step of bonding, for example, a protective film, a polarizing plate, and/or a touch panel (not shown in the drawings) to the front surface of the sealing layer 40 (which includes the first sealing layer 61 and the second sealing layer 62).

The present embodiment, in which the sealing layer 40 (more precisely, the second sealing layer 62) is in contact with the foundation layer 20 (in the examples illustrated in FIG. 9 and (c) of FIG. 11, the edge cover 16) via the contact holes 34, produces effects similar to those produced by Embodiment 1. The present embodiment additionally produces the effects described below.

FIG. 12 is a cross-sectional view of a main part of an organic EL display device 1 in the step illustrated in (b) of FIG. 11, the view schematically illustrating the structure of the main part and describing effects produced by the present embodiment.

As illustrated in FIG. 12, the present embodiment differs from Embodiment 1 in that a first sealing layer 61 is formed on the upper electrode 33 before contact holes 34 are etched.

Thus, as illustrated in FIG. 12, even if during the etching of contact holes 34 in the step S12, the etching gas enters a void 210 between the mask 200 and the organic EL elements 30 covered by the first sealing layer 61, the upper electrode 33 and organic EL layer 32 directly above the light-emitting portion 4 are covered by the first sealing layer 61 and do not come into contact with the etching gas. This makes it possible to prevent the organic EL elements 30 from being damaged by the etching gas.

The upper electrode 33 in the non-light-emitting portion 5 is also covered by the first sealing layer 61. This makes it possible to prevent the upper electrode 33 in a region other than the contact holes 34 from being damaged, thereby preventing the upper electrode 33 from being torn or having a high resistance.

<Thickness of Sealing Layer 40>

The present embodiment may, as well as Embodiment 1, be configured such that the sealing layer 40 has a thickness (specifically, the combined thickness of the first sealing layer 61 and the second sealing layer 62) of, for example, 1 µm to 20 µm at a portion other than the contact holes 34.

The first sealing layer 61 is thick enough to prevent the upper electrode 33 and organic EL layer 32 directly above the light-emitting portion 4 from being damaged by the etching gas. The thickness should suitably be not less than 100 nm.

Typically, a method such as CVD and sputtering which method is used for formation of a sealing layer results in more pinholes and decreased coatability in a case where the sealing layer has a thickness of not more than 100 nm. The first sealing layer 61 should desirably have a thickness of not less than 100 nm. The thickness may be within a range other than the above if it is possible to form a film having a thickness of approximately 10 nm with only a small number of pinholes and high coatability, for instance, in a case where a method such as ALD method is used.

The first sealing layer 61 should desirably have a thickness of not more than 500 nm. If the first sealing layer 61 has a thickness of more than 500 nm, it is undesirable in terms of stress, and forming openings 61a requires a long time. Such a large thickness can thus be a factor of a cost increase.

<Structure of Second Sealing Layer 62 Inside Contact Holes 34>

(a) and (b) of FIG. 13 are each a cross-sectional view illustrating the structure of a second sealing layer 62 inside a contact hole 34 for a case in which the second sealing layer 62 has a layered structure. (a) of FIG. 13 illustrates a case in which a buffer layer is not formed in the contact hole 34 for planarization. (b) of FIG. 13 illustrates a case in which a buffer layer is formed in the contact hole 34 for planarization.

(a) of FIG. 13 illustrates an example case in which the second sealing layer 62 has a layered structure including a first barrier layer 63, a first buffer layer 64, and a second barrier layer 65 in this order from the side of the first sealing layer 61.

As illustrated in (a) of FIG. 13, in a case where the second sealing layer 62 has a layered structure and no planarizing process is carried out for the contact holes 34, the second sealing layer 62 (sealing layer 40) basically has a layered structure in the contact holes 34 as well. In a case where, for example, the first buffer layer 64 has a low fluidity, the first barrier layer 63, the first buffer layer 64, and the second barrier layer 65 are each so shaped as to fill the contact holes 34.

(a) of FIG. 13 illustrates an example case in which the second sealing layer 62 has a layered structure including a first buffer layer 66, a first barrier layer 67, a second buffer layer 68, and a second barrier layer 69 in this order from the side of the first sealing layer 61.

As illustrated in (b) of FIG. 13, a buffer layer with a high fluidity can be disposed as, for example, the first buffer layer 66 in the contact holes 34 to bridge the differences in level that are caused by the contact holes 34.

Bridge the differences in level that are caused by the contact holes 34 as above can relax stress concentration arising from the difference in level of each contact hole 34. This can in turn further reduce peeling of the sealing layer 40 caused by residual stress.

The second sealing layer 62 should preferably have a barrier layer on the front surface as illustrated in (a) and (b) of FIG. 13 so that the front surface of the second sealing layer 62 has a barrier property.

In a case where the organic EL display device 1 includes an adhesive layer and/or filler layer (not shown in the drawings) on the front surface of the second sealing layer 62, the second sealing layer 62 may have a buffer layer on the front surface for improved adherence to such layers. In this case, the buffer layer functions merely as an adherence improving layer.

As described for Embodiment 1, the foundation layer 20 is typically formed during a TFT process, and has a secured adherence to the support 11 and/or an adjacent layer at the interface during the process. The foundation layer 20 thus has a secured adherence to both an organic layer and an inorganic layer. That layer included in the second sealing layer 62 which is in direct contact with the foundation layer 20 may be an organic layer or an inorganic layer, that is, a buffer layer or a barrier layer.

Embodiment 3

Still another embodiment of the present invention is described below with reference to (a) and (b) of FIG. 14. The description below of the present embodiment deals with how the present embodiment differs from Embodiments 1 and 2. Any member of the present embodiment that is identical in function to a member described for Embodiment 1 or 2 is assigned a common reference sign, and is not described here.

The organic EL display device 1 in accordance with the present embodiment is identical in configuration to the organic EL display devices 1 in accordance with Embodiments 1 and 2.

The present embodiment is identical to Embodiments 1 and 2 except that contact holes 34 are etched with use of a laser.

With reference to (a) and (b) of FIG. 14, the description below deals with a method for producing the organic EL display device 1 in accordance with the present embodiment.

The present embodiment is an example in which the foundation layer 20, which is designed to be in direct contact with the sealing layer 40, is an edge cover 16 as illustrated in (b) of FIG. 14. However, as described for Embodiments 1 and 2, the foundation layer 20 may be any of the edge cover 16, the lower electrode 31, the interlayer insulating film 15, the passivation film 14, an insulating film (such as the gate insulating film 52) present on a flat surface between the signal lines 13 and the support, and the support 11 itself.

The present embodiment described here is an example case in which contact holes 34 are formed in the step S8 for Embodiment 1. It is needless to say, however, that a method similar to the method of the present embodiment is usable even in a case where contact holes 34 are formed in the step S12 for Embodiment 2.

<Method for Producing Organic EL Display Device 1>

(a) and (b) of FIG. 14 are cross-sectional views illustrating part of successive steps for producing the organic EL display device 1 in accordance with the present embodiment.

(a) and (b) of FIG. 14 illustrate the production steps S8 and S9 shown in FIG. 10. The production steps S1 to S7 of the present embodiment are identical to those of Embodiment 1, and are as illustrated in the cross-sectional views of (a) to (e) of FIG. 7. The steps S1 to S7 are thus not dealt with in the description below of the present embodiment, and not illustrated in cross-sectional views.

The present embodiment is configured such that after the steps S1 to S7 illustrated in (a) to (e) of FIG. 7, a local portion of each of the upper electrode 33 and the organic EL layer 32 is etched with use of a laser for formation of contact holes 34 as illustrated in (a) of FIG. 14 (step S8).

The laser may, for example, emit a $CO_2$ (carbon dioxide gas) laser beam or a yttrium aluminum garnet (YAG) laser beam.

After the above step, as illustrated in (b) of FIG. 14, a sealing layer 40 is formed on the upper electrode 33 over the entire display region 2 in such a manner as to cover the upper electrode 33 as in Embodiment 1 (step S9).

<Effects>

As described above, the present embodiment uses a laser to form contact holes 34. This eliminates the concern that the organic EL elements 30 may be damaged by an etching gas as in the case of using a CVD device or a dry etcher.

Further, a laser may be pulse-driven while scanning individual sub-pixels 6 to form a large number of contact holes 34 in the non-light-emitting portion 5 without use of a mask.

The present embodiment eliminates the need to prepare a mask for each of organic EL display devices 1 having different panel sizes as in the case of mask etching. The present embodiment only requires the scanning pattern of the laser to be changed for the above purpose. This makes it possible to easily change the shape or number of contact holes 34 to be formed and produce organic EL display devices 1 having different panel sizes.

Embodiment 4

Still another embodiment of the present invention is described below with reference to FIGS. 15 and 16. The description below of the present embodiment deals with how the present embodiment differs from Embodiments 1 to 3. Any member of the present embodiment that is identical in function to a member described for Embodiment 1, 2, or 3 is assigned a common reference sign, and is not described here.

<Schematic Structure of Organic EL Display Device 1>

FIG. 15 is a cross-sectional view of an organic EL display device 1 in accordance with the present embodiment, the view schematically illustrating an example of the structure of a main part of the organic EL display device 1. FIG. 15 schematically illustrates the structure of a portion of the organic EL display device 1 which portion is in the vicinity of a contact hole 34.

The organic EL display device 1 in accordance with the present embodiment, as illustrated in FIG. 15, differs from Embodiments 1 to 3 in that a filler layer 71 is present on the sealing layer 40.

The description below deals with an example of the organic EL display device 1 in accordance with the present embodiment with reference to FIG. 16.

FIG. 16 is a cross-sectional view of an organic EL display device 1 in accordance with the present embodiment, the view schematically illustrating the structure of the organic EL display device 1.

As illustrated in FIG. 16, the organic EL display device 1 in accordance with the present embodiment includes a TFT substrate 10, and also includes, on the TFT substrate 10, organic EL elements 30, a sealing layer 40, a filler layer 71 (functional layer), a sealing member 72, and a counter substrate 80 (functional layer), which are disposed in this order.

The counter substrate 80 includes a support 81, and also includes, on the support 81, members such as a CF layer 82 including color filters (CFs; not shown in the drawings) and a black matrix (BM; not shown in the drawings).

The CFs each have the function of modulating light emitted by the organic EL elements 30. In a case where, for instance, the organic EL elements emit white light, CFs for R, G, and B at the individual sub-pixels 6 modulate the white light into light having the colors of R, G, and B. In a case where individual sub-pixels 6 emit light having the colors of R, G, and B, modulating the light of the sub-pixels 6 through R, G, and B CFs corresponding to the emitted light can, for example, increase the color purity of each color and reduce a tint shift caused by a change in the viewing angle.

Including a CF layer 82 as above makes it possible to adjust, with use of the CF layer 82, the spectrum of light emitted by the organic EL elements 30. However, in a case where (i) single-color light emission is sufficient or (ii) there is no problem with the color purity or tint shift of light emitted by the organic EL elements 30, the CF layer 82 may be omitted.

The organic EL display device 1 in accordance with the present embodiment is of a top emission type, that is, it emits light outward from the side of the counter substrate 80.

The counter substrate 80 is thus a transparent substrate (light-transmitting substrate), and includes a transparent support as the support 81. The support 81 may be a support similar to the support 11 of the organic EL display device 1 for Embodiment 1.

For the present embodiment as well, the support 11 may be a support similar to the support 11 of the organic EL display device 1 for Embodiment 1. The organic EL display device 1 in accordance with the present embodiment may use an opaque material for a support on the side on which light is not emitted. Thus, in a case where the organic EL display device 1 in accordance with the present embodiment is of a top emission type as described above, the support 11 may be a support made of an opaque material.

In a case where the counter substrate 80 and the TFT substrate 10 are both flexible substrates as in a case where the supports 11 and 81 are each made of, for example, a flexible, insulating film, the organic EL display device 1 may be a flexible display or a bendable display.

The filler of which the filler layer 71 is made fills the space defined by the TFT substrate 10, the counter substrate 80, the sealing member 72, and the sealing layer 40.

The sealing member 72 may be a publicly known sealing member. The sealing member 72 should suitably be made of a material with a low moisture permeability.

The filler may be a publicly known filler as well. The filler may be, for example, a material with a low moisture permeability or a material containing, for example, a drying agent and/or an oxygen absorbent.

The filler may be a curable filler or a non-curable filler.

In a case where the filler is a non-curable filler, the filler is present in liquid form in the above space, that is, between the TFT substrate 10 and the counter substrate 80. Thus, in a case where the filler is a non-curable filler, the sealing member 72 is necessary.

In a case where (i) the filler is a curable filler and (ii) the filler layer 71 and the sealing layer 40 reliably prevent entry of, for example, external water and oxygen, the sealing member 72 may be omitted.

<Method for Producing Organic EL Display Device 1>

The present embodiment is configured to (i) form a sealing layer 40 as in Embodiments 1 to 3 and then (ii) form a sealing member 72 in such a manner that the sealing member 72 surrounds that region of the TFT substrate 10 in which the sealing layer 40 is present. During this stage, a gap spacer may be used to prevent the counter substrate 80 from hitting the TFT substrate 10 and to thereby prevent the organic EL elements 30 from being damaged.

Next, a filler of which the filler layer 71 is to be made is injected into the space defined by the TFT substrate 10 and the sealing member 72.

After that, the counter substrate 80 is attached to the TFT substrate 10 with the sealing member 72 and the filler layer 71 therebetween, so that the filler is sealed up between a pair of substrates (namely, the TFT substrate 10 and the counter substrate 80). In a case where the counter substrate 80 includes a CF layer 82, the counter substrate 80 and the TFT substrate 10 are, before being attached to each other, aligned with each other so that the CFs and the organic EL elements 30 coincide with each other at the sub-pixels 6. This produces the organic EL display device 1 in accordance with the present embodiment.

<Effects>

The present embodiment, in which as described above, (i) the organic EL elements 30 are sealed up between a pair of substrates and (ii) the sealing layer 40 is covered by the filler layer 71, further reduces the amount of, for example, external water and oxygen permeating through the surface of the sealing layer 40. This makes it possible to further reduce degradation of the organic EL elements 30 and thus further improve the reliability of the organic EL display device 1.

The interfaces between the individual layers of the organic EL display device 1 are each subjected to a thermal stress due to the difference in the coefficient of thermal expansion between the different materials at the environmental temperature. The present embodiment includes a filler layer 71 on the sealing layer 40 as described above. The filler layer 71 also causes a thermal stress on the interfaces between the individual layers.

In the case where the organic EL display device 1 is a flexible organic EL display device, bending the organic EL display device 1 causes a bending stress on the individual layers due to the difference in the coefficient of elasticity between the different materials. The coefficient of elasticity of the filler layer 71 also influences the degree of the bending stress.

Thus, in a case where a filler layer 71 is present on the sealing layer 40, the interfaces between the individual layers of the organic EL display device 1 are each subjected to a more complex stress, which may in turn cause more film peeling.

Forming openings 33a in the upper electrode 33 and openings 32a in the organic EL layer 32 for contact holes 34 and causing the sealing layer 40 to be in direct contact with, for example, the front surface of the edge cover 16 in the contact holes 34 as illustrated in FIG. 15 can reduce the risk of the sealing layer 40 being peeled from the TFT substrate 10.

As described above, the contact holes 34 function effectively for an organic EL display device 1 including a filler layer 71 as described above.

<Variations>

The present embodiment described here is an example case in which the organic EL display device 1 is of a top emission type. The organic EL display device 1 in accordance with the present embodiment may alternatively be of a bottom emission type. In a case where the organic EL display device 1 in accordance with the present embodiment is of a bottom emission type, the CF layer 82 may be present on the side of the TFT substrate 10.

FIG. 15 shows an edge cover 16 as an example of the foundation layer 20 (which is designed to be in direct contact with the sealing layer 40). The present embodiment is, however, not limited to such a configuration. The foundation layer 20 (which is designed to be in direct contact with the sealing layer 40) may be any of the edge cover 16, the lower electrode 31, the interlayer insulating film 15, the passivation film 14, an insulating film (such as the gate insulating film 52) present on a flat surface between the signal lines 13 and the support, and the support 11 itself. The respective positions of the contact holes 34 may be changed similarly to Embodiment 1. Needless to say, the present embodiment may also be configured such that as in Embodiment 1, contact holes 34 are formed not only in a non-light-emitting portion 5 in each sub-pixel 6, but also in a non-light-emitting portion 5 along the periphery of the display region 2.

[Recap]

An EL display device in accordance with a first aspect of the present invention (for example, an organic EL display device 1) includes: a plurality of EL elements (for example, organic EL elements 30) each including (i) a lower electrode 31, an upper electrode 33, and an EL layer (for example, an organic EL layer 32) disposed between the lower electrode 31 and the upper electrode 33 and including a light-emitting layer; and a sealing layer 40 covering the plurality of EL elements, the EL display device having, in a non-light-emitting portion 5 of the display region 2, at least one contact hole (contact hole 34 or 34') extending through at least the upper electrode and the EL layer and allowing the sealing layer 40 to be in contact with a surface of a layer below the EL layer (for example, an edge cover 16, the lower electrode 31, an interlayer insulating film 15, a passivation film 14, a gate insulating film 52, a base coat [not shown in the drawings], or a support 11).

The above configuration can improve the adherence of the sealing layer 40 in the display region 2. This makes it possible to prevent, for example, the sealing layer 40 from being peeled due to stress and also prevent the upper electrode 33, the EL layer, and the like from being peeled together with the sealing layer 40 being peeled off. The above configuration, which can improve the adherence of the sealing layer 40, allows a thick sealing layer 40 to be formed. The above configuration, therefore, makes it possible to provide an EL display device that is excellent in sealing capability, moisture barrier property, and breakage endurance and that is free from layer peeling.

An EL display device in accordance with a second aspect of the present invention (for example, an organic EL display device 1) may be configured as in the first aspect, and be further configured such that the EL display device has, in the display region 2, a plurality of sub-pixels 6 each having one of the plurality of EL elements (for example, organic EL elements 30) and surrounded by a plurality of wires (signal lines 13) in a plan view; and the layer below the EL layer is above the plurality of wires (for example, an edge cover 16, the lower electrode 31, an interlayer insulating film 15, or a passivation film 14).

The above configuration prevents the signal lines 13 from being exposed at a contact hole, and thus allows contact holes to be formed directly above the signal lines 13. This can in turn reduce a decrease in the aperture ratio.

An EL display device in accordance with a third aspect of the present invention (for example, an organic EL display device 1) may be configured as in the second aspect, and be further configured such that the plurality of EL elements (for example, organic EL elements 30) are disposed on a planarizing film (interlayer insulating film 15) for planarization of an upper surface of a circuit (TFTs 12 and signal lines 13) disposed on a support 11 and including the plurality of wires (signal lines 13) on which support 11 a plurality of transistors (TFTs 12) are disposed that are covered by a protective film (passivation film 14); the respective lower electrodes 31 of the plurality of EL elements each have an edge portion covered by an edge cover 16; and the layer below the EL layer (for example, an organic EL layer 32) is one of the edge cover 16, the lower electrode 31, the planarizing film (interlayer insulating film 15), and the protective film (passivation film 14).

The edge cover 16, the lower electrode 31, the planarizing film (interlayer insulating film 15), and the protective film (passivation film 14) are each formed by a TFT process and are each a strong film as compared to a deposited film. This allows for a secured adherence to the support 11 during the process or a secured adherence at the interface with an adjacent layer. Thus, causing the sealing layer 40 to be in tight contact with such layers can improve the adherence of the sealing layer 40.

An EL display device in accordance with a fourth aspect of the present invention (for example, an organic EL display device 1) may be configured as in the second or third aspect, and be further configured such that the at least one contact hole (contact hole 34) overlaps with a portion of the plurality of wires (signal lines 13) in a plan view.

The above configuration can reduce a decrease in the aperture ratio.

An EL display device in accordance with a fifth aspect of the present invention (for example, an organic EL display device 1) may be configured as in any one of the second to fourth aspects, and be further configured such that the at least one contact hole (contact hole 34 or 34') includes at least one contact hole for each of the plurality of sub-pixels 6.

The above configuration can improve the adherence of the sealing layer 40 in the display region 2.

An EL display device in accordance with a sixth aspect of the present invention (for example, an organic EL display device 1) may be configured as in any one of the first to fifth aspects, and be further configured such that the sealing layer 40 includes a first sealing layer 61 and a second sealing layer 62; the first sealing layer 61 has at least one opening 61a included in the at least one contact hole (contact hole 34 or 34'); and the second sealing layer 62 is in contact with the surface of the layer below the EL layer at the at least one contact hole.

With the above configuration, when contact holes are formed (opened) with use of, for example, an etching gas, the EL elements do not come into contact with an etching gas because the EL elements are covered by the first sealing layer 61. This can reduce the risk of the EL elements being damaged by an etching gas.

An EL display device in accordance with a seventh aspect of the present invention (for example, an organic EL display device 1) may be configured as in the sixth aspect, and be further configured such that the first sealing layer 61 includes an inorganic insulating layer, an organic insulating layer, or a layered combination of an inorganic insulating layer and an organic insulating layer; the second sealing layer 62 includes an inorganic insulating layer or a layered combination of an inorganic insulating layer and an organic insulating layer; and the inorganic insulating layer included in the second sealing layer 62 is at a surface thereof.

The inorganic insulating layer has the function of preventing entry of water for moisture prevention, and thus serves as a barrier layer. The organic insulating layer is used as a buffer layer (stress relaxation layer): It relaxes stress on the inorganic insulating layer, covers a pinhole, and/or prevents a crack in and peeling of the inorganic insulating layer when it is being disposed. As the second sealing layer 62 includes an inorganic insulating layer at its front surface, the sealing layer 40 (which includes the first sealing layer 61 and the second sealing layer 62) can have a barrier property on its front surface.

An EL display device in accordance with an eighth aspect of the present invention (for example, an organic EL display device 1) may be configured as in the sixth or seventh aspect, and be further configured such that the second sealing layer 62 includes a layered combination of an inorganic insulating layer and an organic insulating layer; and a difference in level which difference is caused by the at least one contact hole (contact hole 34 or 34') is bridged with use of the organic insulating layer of the second sealing layer 62 for planarization.

Bridge the differences in level that are caused by the contact holes as above can relax stress concentration arising from the difference in level of each contact hole. The above configuration can thus further reduce peeling of the sealing layer 40 caused by residual stress.

An EL display device in accordance with a ninth aspect of the present invention (for example, an organic EL display device 1) may be configured as in any one of the first to eighth aspects, and further include: a functional layer (for example, a counter substrate 80 on which a CF layer 82 is present, a filler layer 71 disposed between the counter substrate 80 and another substrate, a protective film, a polarizing plate, a touch panel, or a hard coat layer [not shown in the drawings]) on the sealing layer 40.

In a case where a functional layer is additionally present on the sealing layer 40, the functional layer causes, for example, a thermal stress and a bending stress on the interfaces between the individual layers, and those interfaces between the individual layers are thus each subjected to a more complex stress. The technique disclosed herein can prevent film peeling in such an EL display device as well.

A method in accordance with a tenth aspect of the present invention for producing an EL display device (for example, an organic EL display device 1) includes the steps of: (a) forming, on a support 11 on which a plurality of transistors (TFTs 12) covered by a protective film (passivation film 14)

and a circuit including a plurality of wires (signal lines) are disposed, a plurality of EL elements (for example, organic EL elements 30) each including (i) a lower electrode 31, (ii) an upper electrode 33, and (iii) an EL layer (for example, an organic EL layer 32) disposed between the lower electrode 31 and the upper electrode 33 and including a light-emitting layer; (b) forming, in a non-light-emitting portion 5 of a display region 2, a contact hole (contact hole 34 or 34') configured to allow a sealing layer 40 to be in contact with a surface of a layer below the EL layer (for example, an edge cover 16, the lower electrode 31, an interlayer insulating film 15, a passivation film 14, a gate insulating film 52, a base coat [not shown in the drawings], or the support 11); and (c) forming the sealing layer 40 over the support 11 in such a manner that the sealing layer 40 covers the plurality of EL elements and thereby allowing the sealing layer 40 to be in contact with the surface of the layer below the EL layer at the contact hole.

The above configuration can produce effects similar to those produced by the first aspect above.

A method in accordance with an eleventh aspect of the present invention for producing an EL display device (for example, an organic EL display device 1) may be configured as in the tenth aspect, and be further configured such that the sealing layer includes a first sealing layer and a second sealing layer; the method further includes, before the step (b), the step of forming, over the support 11, the first sealing layer 61 in such a manner that the first sealing layer 61 covers the plurality of EL elements; the second sealing layer 62 is disposed on the first sealing layer 61 and is in contact with the surface of the layer below the EL layer at the contact hole (contact hole 34 or 34'); the step (b) is a step of forming the contact hole in layers between the second sealing layer 62 and the surface of the layer below the EL layer which layers include the first sealing layer 61, the upper electrode 33, and the EL layer; and the step (c) is a step of forming the second sealing layer 62 over the support 11 in such a manner that the second sealing layer 62 covers the plurality of EL elements, covered by the first sealing layer 61, which has a portion of the contact hole, and thereby allowing the second sealing layer 62 to be in contact with the surface of the layer below the EL layer at the contact hole.

The above configuration can produce effects similar to those produced by the sixth aspect above.

A method in accordance with a twelfth aspect of the present invention for producing an EL display device (for example, an organic EL display device 1) may be configured as in the tenth or eleventh aspect, and be further configured such that the step (b) involves (i) using a mask 200 having an opening 201 corresponding to the contact hole and (ii) forming the contact hole by causing an etching gas to come into contact with a layer exposed at the opening 210 of the mask 200.

The above method makes it possible to form high-definition contact holes.

A method in accordance with a thirteenth aspect of the present invention for producing an EL display device (for example, an organic EL display device 1) may be configured as in the twelfth aspect, and be further configured such that the step (b) involves forming the contact hole by CVD.

The above method makes it possible to use the same CVD device for the formation of the contact holes and the formation of the sealing layer 40 (for example, the first sealing layer 61 and the second sealing layer 62). This in turn makes it possible to form a sealing layer 40 continuously (including etching) with use of a CVD device. The above method thus makes it possible to reduce device costs, shorten the cycle time, and prevent entry of particles.

A method in accordance with a fourteenth aspect of the present invention for producing an EL display device (for example, an organic EL display device 1) may be configured as in the twelfth aspect, and be further configured such that the step (b) involves forming the contact hole by dry etching.

The above method makes it possible to form high-definition contact holes.

A method in accordance with a fifteenth aspect of the present invention for producing an EL display device (for example, an organic EL display device 1) may be configured as in the tenth or eleventh aspect, and be further configured such that the step (b) involves forming the contact hole (contact hole 34 or 34') with use of a laser.

The above method eliminates the concern of the EL elements being damaged by an etching gas, and also makes it possible to form a large number of contact holes in the non-light-emitting portion 5 without use of a mask. This makes it possible to easily change the shape or number of contact holes to be formed and produce EL display devices having different panel sizes.

The present invention is not limited to the embodiments, but can be altered by a skilled person in the art within the scope of the claims. The present invention also encompasses, in its technical scope, any embodiment derived by combining technical means disclosed in differing embodiments. Further, it is possible to form a new technical feature by combining the technical means disclosed in the respective embodiments.

INDUSTRIAL APPLICABILITY

The present invention is suitably applicable to a display device including EL elements such as a television and an electronic paper, in particular, to (i) a bendable display device such as a flexible display and (ii) formation of a sealing layer for covering EL elements of such a display device.

REFERENCE SIGNS LIST

1 Organic EL display device (EL display device)
2 Display region
3 Non-display region
4 Light-emitting portion
5 Non-light-emitting portion
6 Sub-pixel
10 TFT substrate
11, 81 Support
12 TFT (transistor)
13 Signal line (wire)
14 Passivation film (protective film)
14a, 15a Contact hole
14b, 15b, 16a, 16b, 31a, 32a, 33a, 52a, 61a Opening
15 Interlayer insulating film (planarizing film)
16 Edge cover
20 Foundation layer
30 Organic EL element (EL element)
31 Lower electrode
32 Organic EL layer (EL layer)
33 Upper electrode
34, 34' Contact hole
40 Sealing layer
41 First barrier layer
42 Buffer layer
43 Second barrier layer 44 Contact portion
51 Gate electrode
52 Gate insulating film
53 Semiconductor layer
54 Drain electrode
55 Source electrode
61 First sealing layer
62 Second sealing layer
63 First barrier layer
64 First buffer layer
65 Second barrier layer
66 First buffer layer
67 First barrier layer
68 Second buffer layer
69 Second barrier layer
71 Filler layer
72 Sealing member
80 Counter substrate (functional layer)
82 CF layer
200 Mask
201 Opening
210 Gap

The invention claimed is:

1. An EL display device, comprising:
a plurality of EL elements each including (i) a lower electrode, (ii) an upper electrode, and (iii) an EL layer disposed between the lower electrode and the upper electrode and including a light-emitting layer; and
a sealing layer covering the plurality of EL elements,
each of the lower electrodes of the plurality of EL elements including an edge portion covered by an edge cover,
the EL display device having, in a non-light-emitting region of a display region, at least one contact hole extending through at least the upper electrode, the EL layer, and the edge cover and allowing the sealing layer to be in contact with a surface of a layer below the EL layer, wherein
the EL display device includes, in the display region, a plurality of sub-pixels each including one of the plurality of EL elements and surrounded by a plurality of wires in a plan view,
the layer below the EL layer is above the plurality of wires, and
the at least one contact hole overlaps with a portion of the plurality of wires in the plan view.

2. The EL display device according to claim 1, wherein
the plurality of EL elements are disposed on a planarizing film for planarization of an upper surface of a circuit disposed on a support and including a plurality of transistors and the plurality of wires, the plurality of transistors and the plurality of wires being covered by a protective film; and
the layer below the EL layer is one of the lower electrode, the planarizing film, and the protective film.

3. The EL display device according to claim 1,
wherein the at least one contact hole includes at least one contact hole for each of the plurality of sub-pixels.

4. The EL display device according to claim 1, further comprising:
a functional layer on the sealing layer.

5. The EL display device according to claim 1,
wherein:
the at least one contact hole is in a shape of a slit in a portion of the non-light-emitting region of the display region which portion is between light-emitting regions; and
the at least one contact hole penetrates the upper electrode, the EL layer, and the edge cover.

6. The EL display device according to claim 1,
wherein
the at least one contact hole is in a shape of a slit in a portion of the non-light-emitting region of the display region which portion is between light-emitting regions;
the plurality of EL elements are disposed on a planarizing film for planarization of an upper surface of a circuit disposed on a support and including a plurality of transistors and a plurality of wires, the plurality of transistors and the plurality of wires being covered by a protective film; and
the at least one contact hole penetrates the upper electrode, the EL layer, the edge cover, and the planarizing film.

7. An EL display device, comprising:
a plurality of EL elements each including (i) a lower electrode, (ii) an upper electrode, and (iii) an EL layer disposed between the lower electrode and the upper electrode and including a light-emitting layer; and
a sealing layer covering the plurality of EL elements,
each of the lower electrodes of the plurality of EL elements including an edge portion covered by an edge cover;
the EL display device including, in a non-light-emitting region of a display region, at least one contact hole extending through at least the upper electrode, the EL layer, and the edge cover and allowing the sealing layer to be in contact with a surface of a layer below the EL layer;
the sealing layer includes a first sealing layer and a second sealing layer;
the first sealing layer has at least one opening included in the at least one contact hole; and
the second sealing layer is in contact with the surface of the layer below the EL layer at the at least one contact hole.

8. The EL display device according to claim 7,
wherein
the first sealing layer includes an inorganic insulating layer, an organic insulating layer, or a layered combination of an inorganic insulating layer and an organic insulating layer;
the second sealing layer includes an inorganic insulating layer or a layered combination of an inorganic insulating layer and an organic insulating layer; and
the inorganic insulating layer included in the second sealing layer is at a surface thereof.

9. The EL display device according to claim 7,
wherein
the second sealing layer includes a layered combination of an inorganic insulating layer and an organic insulating layer; and
a difference in level which difference is caused by the at least one contact hole is bridged with use of the organic insulating layer of the second sealing layer.

10. The EL display device according to claim 7, wherein the EL display device includes, in the display region, a plurality of sub-pixels each including one of the plurality of EL elements and surrounded by a plurality of wires in a plan view, and the layer below the EL layer is above the plurality of wires.

11. The EL display device according to claim 7, wherein the plurality of EL elements are disposed on a planarizing film for planarization of an upper surface of a circuit disposed on a support and include a plurality of transistors and the plurality of wires, the plurality of transistors and the plurality of wires being covered by a protective film; and the layer below the EL layer is one of the edge cover, the lower electrode, the planarizing film, and the protective film.

12. The EL display device according to claim 7, wherein the at least one contact hole overlaps with a portion of the plurality of wires in a plan view.

13. The EL display device according to claim 7, wherein the at least one contact hole includes at least one contact hole for each of the plurality of sub-pixels.

14. The EL display device according to claim 7, further comprising a functional layer on the sealing layer.

15. The EL display device according to claim 7, wherein
the at least one contact hole is in a shape of a slit in a portion of the non-light-emitting region of the display region which portion is between light-emitting regions; and
the at least one contact hole penetrates the upper electrode, the EL layer, and the edge cover.

16. The EL display device according to claim 7, wherein
the at least one contact hole is in a shape of a slit in a portion of the non-light-emitting region of the display region which portion is between light-emitting regions;
the plurality of EL elements are disposed on a planarizing film for planarization of an upper surface of a circuit disposed on a support and including a plurality of transistors and a plurality of wires, the plurality of transistors and the plurality of wires being covered by a protective film; and
the at least one contact hole penetrates the upper electrode, the EL layer, the edge cover, and the planarizing film.

17. An EL display device, comprising:
a plurality of EL elements each including (i) a lower electrode, (ii) an upper electrode, and (iii) an EL layer disposed between the lower electrode and the upper electrode and including a light-emitting layer; and
a sealing layer covering the plurality of EL elements,
each of the lower electrodes of the plurality of EL elements including an edge portion covered by an edge cover;
the EL display device including, in a non-light-emitting region of a display region, at least one contact hole extending through at least the upper electrode, the EL layer, and the edge cover and allowing the sealing layer to be in contact with a surface of a layer below the EL layer;
the at least one contact hole is in a shape of a slit in a portion of the non-light-emitting region of the display region which portion is between light-emitting regions;
the plurality of EL elements are disposed on a planarizing film for planarization of an upper surface of a circuit disposed on a support and including a plurality of transistors and a plurality of wires, the plurality of transistors and the plurality of wires being covered by a protective film; and
the at least one contact hole penetrates the upper electrode, the EL layer, the edge cover, the planarizing film, and the protective film.

18. The EL display device according to claim 17, wherein
the plurality of EL elements are disposed on or over a gate insulating film and the planarizing film; and
the at least one contact hole penetrates the upper electrode, the EL layer, the edge cover, the planarizing film, the protective film, and the gate insulating film.

19. The EL display device according to claim 17, wherein the at least one contact hole includes at least one contact hole for each of the plurality of sub-pixels.

20. The EL display device according to claim 17, further comprising a functional layer on the sealing layer.

* * * * *